(12) United States Patent
Itkin

(10) Patent No.: US 11,668,792 B2
(45) Date of Patent: *Jun. 6, 2023

(54) SAFETY COMPLIANT RECEIVER MONITORING

(71) Applicant: Infineon Technologies AG, Neubiberg (DE)

(72) Inventor: Grigory Itkin, Munich (DE)

(73) Assignee: Infineon Technologies AG, Neubiberg (DE)

( * ) Notice: Subject to any disclaimer, the term of this patent is extended or adjusted under 35 U.S.C. 154(b) by 282 days.

This patent is subject to a terminal disclaimer.

(21) Appl. No.: 16/946,978

(22) Filed: Jul. 14, 2020

(65) Prior Publication Data

US 2021/0055377 A1   Feb. 25, 2021

Related U.S. Application Data

(63) Continuation-in-part of application No. 16/545,879, filed on Aug. 20, 2019, now Pat. No. 11,221,398.

(51) Int. Cl.
  *G01S 7/40* (2006.01)
  *H03H 7/38* (2006.01)

(52) U.S. Cl.
  CPC .............. *G01S 7/40* (2013.01); *G01S 7/4021* (2013.01); *H03H 7/38* (2013.01)

(58) Field of Classification Search
  CPC .......... G01S 7/032; G01S 7/40; G01S 7/4021; G01S 7/4052; G01S 7/4069; H03H 7/38
  See application file for complete search history.

(56) References Cited

U.S. PATENT DOCUMENTS

| | | |
|---|---|---|
| 2006/0250158 A1 | 11/2006 | Yaguchi |
| 2013/0094556 A1 | 4/2013 | Itkin |
| 2018/0062605 A1* | 3/2018 | Brounley ................. H03H 7/38 |
| 2019/0068156 A1 | 2/2019 | Hueber et al. |
| 2019/0068298 A1 | 2/2019 | Sharma et al. |
| 2019/0245389 A1* | 8/2019 | Johnston ................. H02J 50/20 |
| 2019/0318919 A1* | 10/2019 | Lyndaker .......... H01J 37/32935 |
| 2021/0055379 A1 | 2/2021 | Itkin |

* cited by examiner

*Primary Examiner* — Timothy X Pham
(74) *Attorney, Agent, or Firm* — Harrity & Harrity, LLP

(57) ABSTRACT

A device may include a receive antenna input to couple a receive chain of the device to a receive antenna. The device may include a test signal generator. The device may include a switchable impedance matching circuit coupled to the test signal generator and to the receive chain to cause an impedance matching between the test signal generator and at least one component of the receive chain to depend on an impedance of the receive antenna in an antenna monitoring phase. The antenna monitoring phase may be associated with determining an impedance mismatching of the receive antenna. The device may include a control circuit to determine the impedance mismatching of the receive antenna in the antenna monitoring phase.

20 Claims, 17 Drawing Sheets

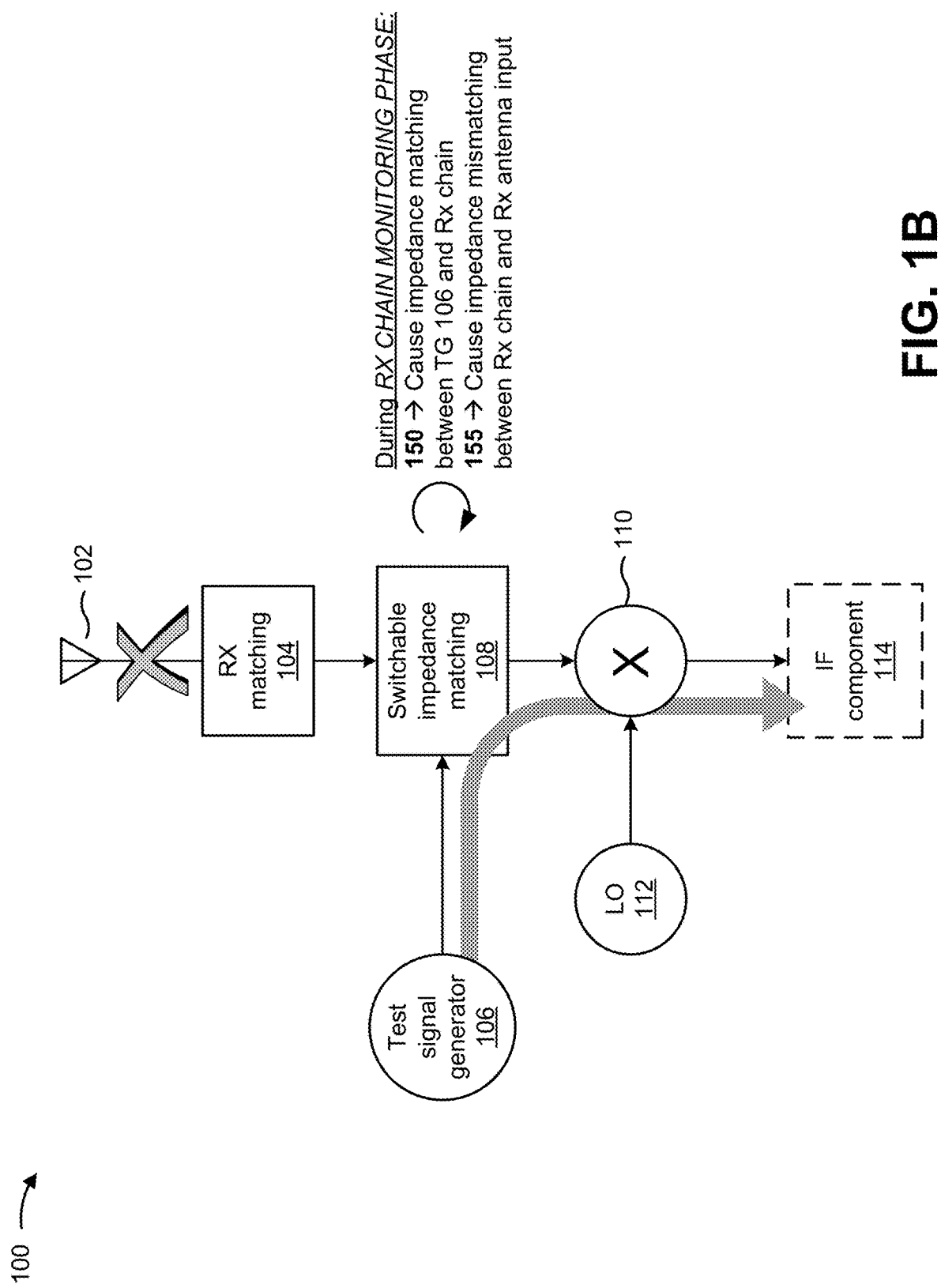

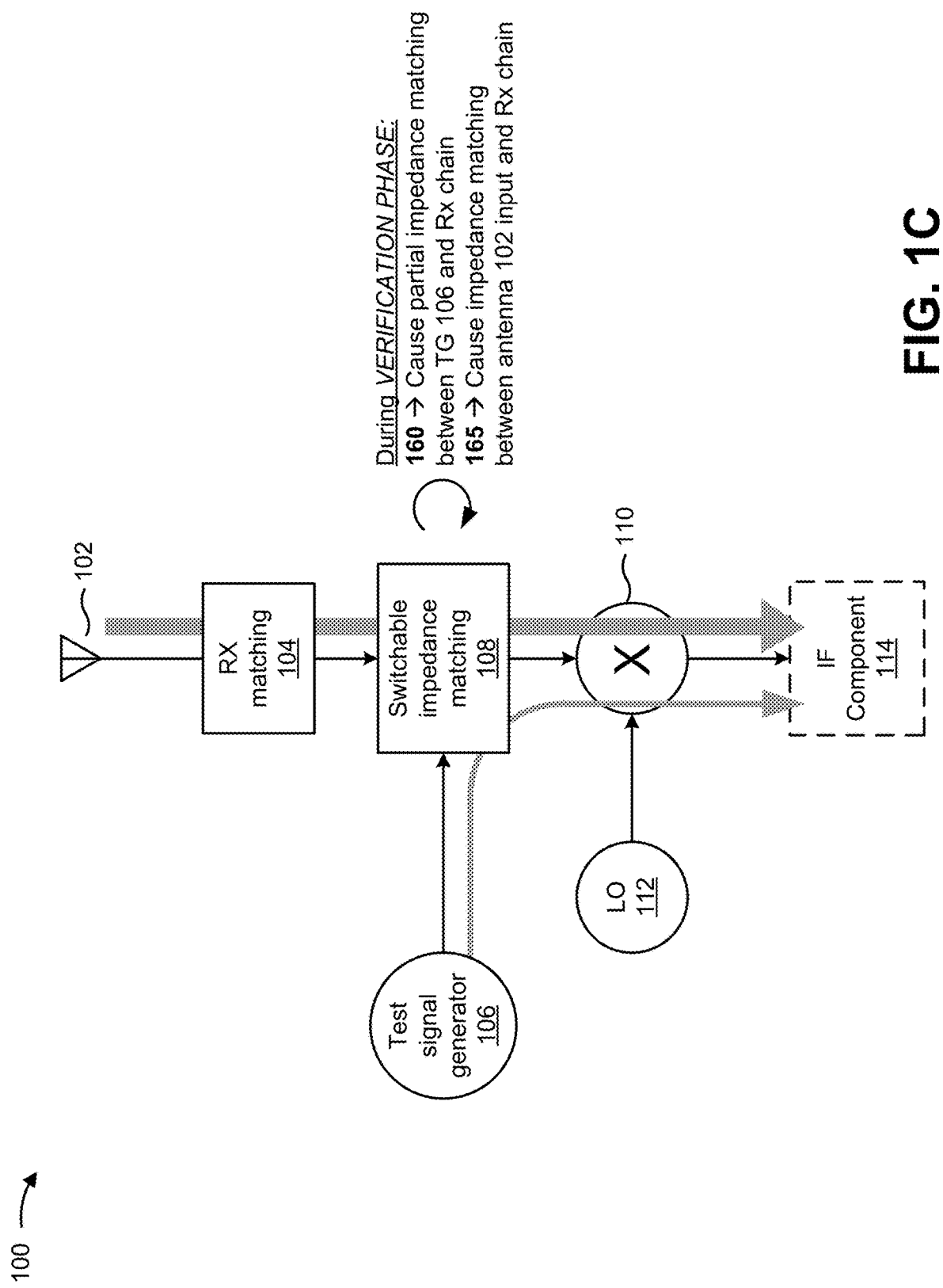

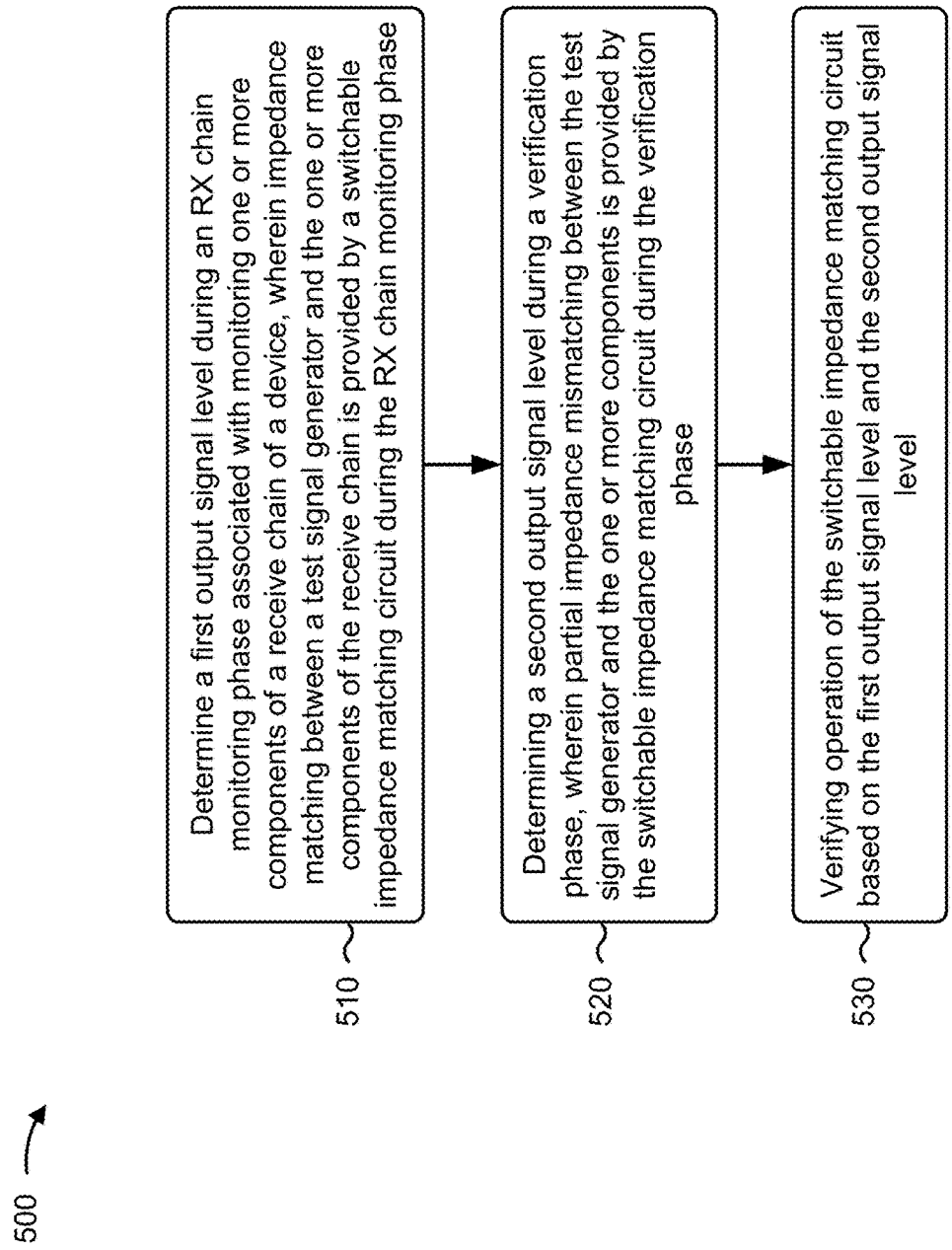

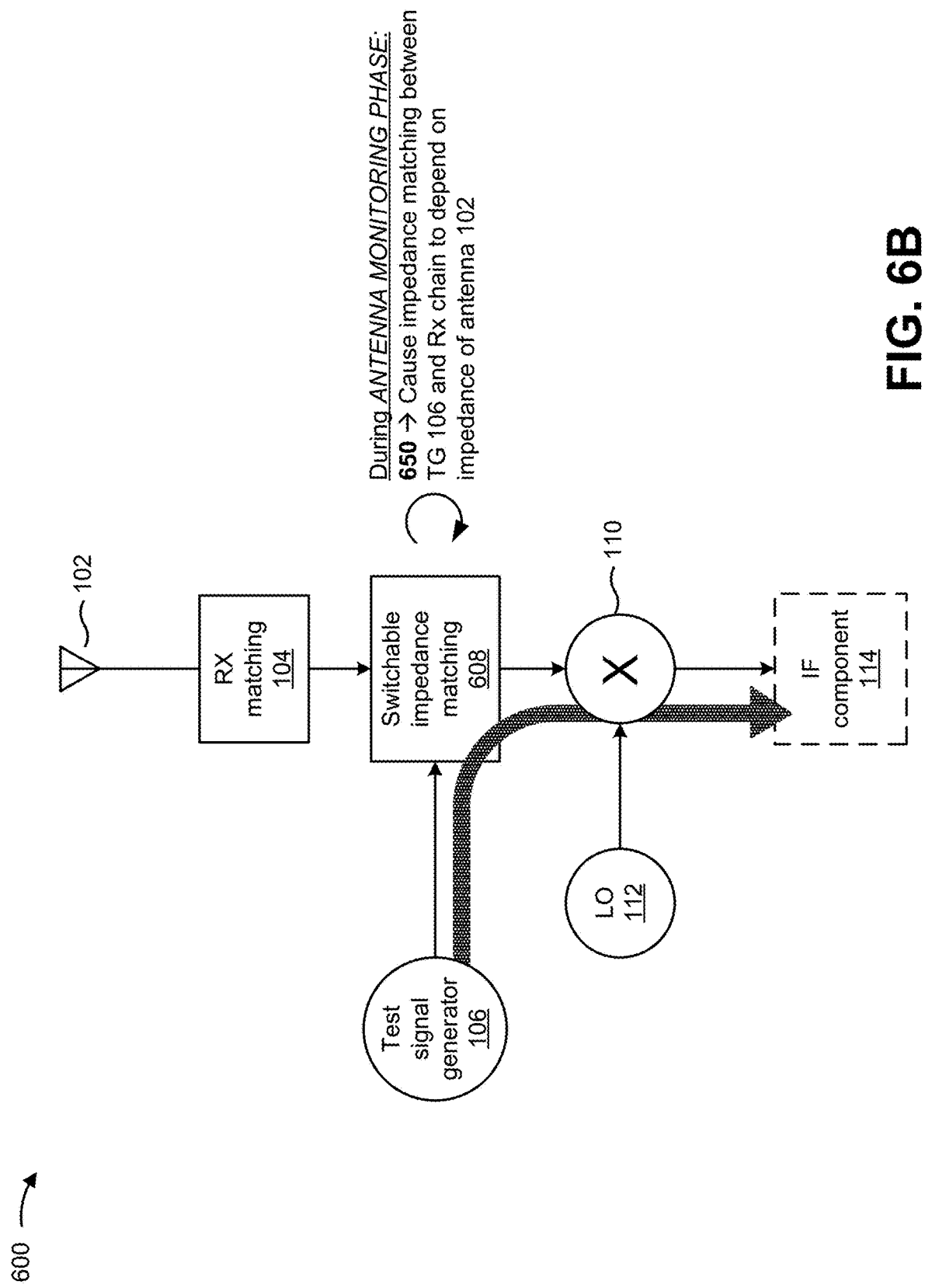

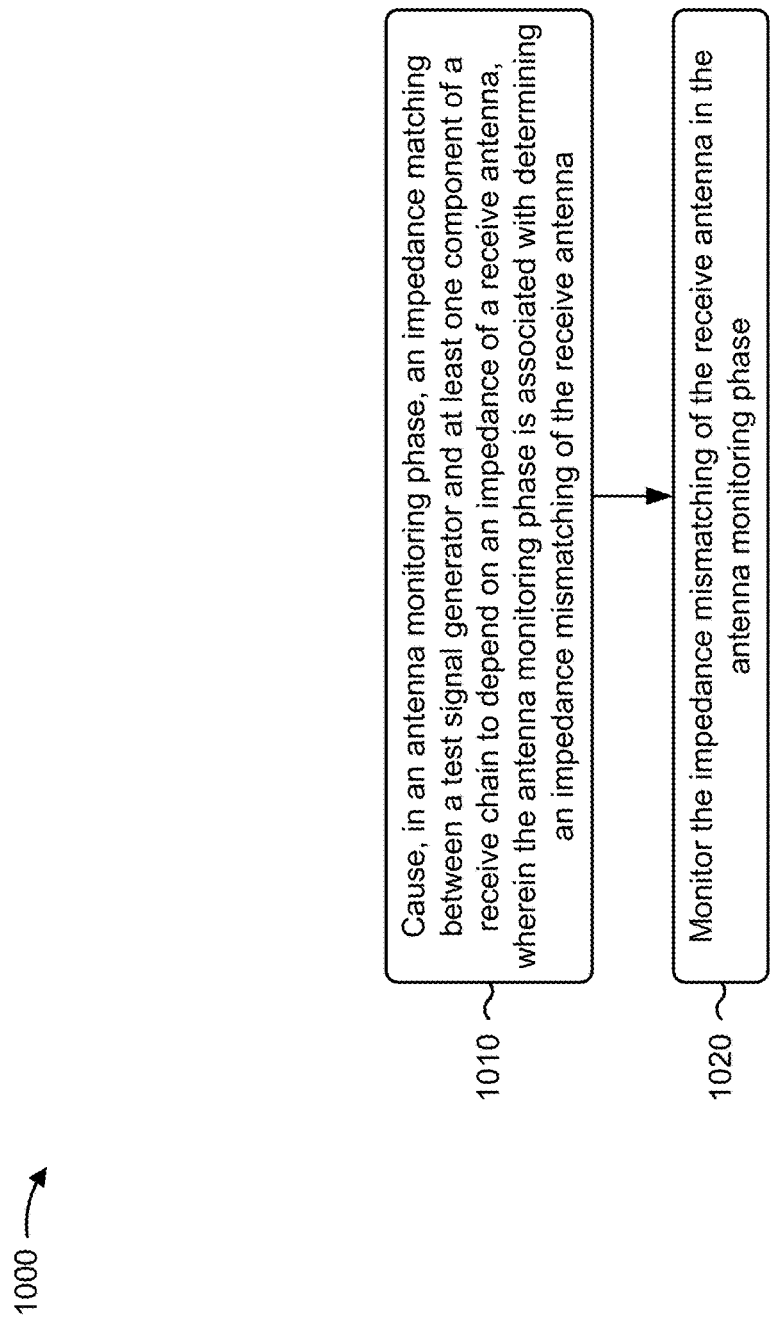

SAFETY COMPLIANT RECEIVER MONITORING

CROSS-REFERENCE TO RELATED APPLICATION

This application is a continuation-in-part (CIP) of U.S. patent application Ser. No. 16/545,879, filed on Aug. 20, 2019, and entitled "SAFETY COMPLIANT RECEIVER MONITORING," the content of which is incorporated by reference herein in its entirety.

BACKGROUND

A radio frequency (RF) device, such as a radar monolithic microwave integrated circuit (MMIC), may need to verify that one or more components of a receive (RX) chain of the RF device are operating according to an applicable specification. In some cases, the RF device may use an RX monitoring procedure in order to perform this verification. A result of the RX monitoring procedure can, however, be impacted by the presence of external distortions received via an antenna of the RF device during performance of the RX monitoring.

Similarly, the RF device may need to evaluate a quality of a connection of an antenna. In a transmit (TX) path, a measurement of an impedance of the antenna may in some cases be used to evaluate a quality of a connection of an antenna. Here, a reflection of a transmitted signal coming from the antenna can be used to detect the antenna impedance and, therefore, a quality of the connection from the TX path to the antenna can be derived. However, there is no transmitted signal in an RX path and, therefore, there is no reflection available to be used for such evaluation of a connection in the RX path. Rather, in the case of an RX path, an RF device typically determines whether an RF ball of the RF device is connected to a printed circuit board (PCB) of the RF device in association with performing such an evaluation.

SUMMARY

According to some implementations, a device may include a receive antenna input to couple a receive chain of the device to a receive antenna; a test signal generator; and a switchable impedance matching circuit coupled to the test signal generator and to the receive chain to: cause an impedance matching between the test signal generator and at least one component of the receive chain to be increased during a RX chain monitoring phase, wherein the impedance matching between the test signal generator and the at least one component of the receive chain is to be increased relative to an impedance matching between the test signal generator and the at least one component of the receive chain during an operational phase, wherein the RX chain monitoring phase is associated with monitoring the at least one component of the receive chain of the device, and wherein the impedance matching during the RX chain monitoring phase enables one or more measurements based on a test signal generated by the test signal generator; and cause a partial impedance mismatching between the test signal generator and the at least one component of the receive chain during a verification phase, wherein the verification phase is associated with verifying a return of the switchable impedance matching circuit to an impedance matching caused during the operational phase; and a control circuit to verify operation of the return of the switchable impedance matching circuit in the verification phase.

According to some implementations, a method may include providing, by a switchable impedance matching circuit, an impedance matching between a test signal generator and at least one component of a receive chain of a device during a RX chain monitoring phase relative to an impedance matching between the test signal generator and the at least one component of the receive chain during an operational phase, wherein the RX chain monitoring phase is associated with monitoring one or more components of the receive chain of the device, and wherein the impedance matching during the RX chain monitoring phase enables one or more measurements based on a test signal generated by the test signal generator; and providing, by the switchable impedance matching circuit, partial impedance mismatching between the test signal generator and the at least one component of the receive chain during a verification phase, wherein the verification phase is associated with verifying a return of the switchable impedance matching circuit to an impedance matching caused during the operational phase.

According to some implementations, a device may include a mismatching switch to: cause, in a first switching state: an impedance mismatching between a receive antenna input and an input of a receive chain, and an impedance matching between a test signal generator and a test signal input of the receive chain, wherein the impedance mismatching between the receive antenna input and the input of the receive chain substantially isolates the input of the receive chain from the receive antenna input; and cause, in a second switching state: an impedance matching between the receive antenna input and the input of the receive chain, and a partial impedance mismatching between the test signal generator and the test signal input of the receive chain.

According to some implementations, a method may include determining a first output signal level during a RX chain monitoring phase associated with monitoring one or more components of a receive chain of a device, wherein impedance matching between a test signal generator and the one or more components of the receive chain is provided by a switchable impedance matching circuit during the RX chain monitoring phase; determining a second output signal level during a verification phase, wherein partial impedance mismatching between the test signal generator and the one or more components is provided by the switchable impedance matching circuit during the verification phase; and verifying operation of the switchable impedance matching circuit based on the first output signal level and the second output signal level.

According to some implementations, a device may include a receive antenna input to couple a receive chain of the device to a receive antenna; a test signal generator; a switchable impedance matching circuit coupled to the test signal generator and to the receive chain to cause an impedance matching between the test signal generator and at least one component of the receive chain to depend on an impedance of the receive antenna in an antenna monitoring phase, wherein the antenna monitoring phase is associated with determining an impedance mismatching of the receive antenna; and a control circuit to determine the impedance mismatching of the receive antenna in the antenna monitoring phase.

According to some implementations, a method may include causing, by a switchable impedance matching circuit and in an antenna monitoring phase, an impedance matching between a test signal generator and at least one component of a receive chain to depend on an impedance of a receive antenna, wherein the antenna monitoring phase is associated with determining an impedance mismatching of the receive antenna; and monitoring, by a control circuit, the impedance mismatching of the receive antenna in the antenna monitoring phase.

According to some implementations, a method may include determining a first output signal level in an operational phase of a device including a receive antenna coupled to a receive chain; determining a second output signal level in an antenna monitoring phase associated with determining an impedance mismatching of the receive antenna, wherein an impedance matching between a test signal generator and one or more components of the receive chain is caused by a switchable impedance matching circuit to depend on an impedance of the receive antenna in the antenna monitoring phase; and determining the impedance mismatching of the receive antenna based on the first output signal level and the second output signal level.

BRIEF DESCRIPTION OF THE DRAWINGS

FIGS. 1A-1C are diagrams of an example implementation described herein.

FIGS. 4 and 5 are flowcharts of example processes associated with safety compliant RX monitoring.

FIGS. 10 and 11 are flowcharts of example processes associated with receive antenna monitoring.

DETAILED DESCRIPTION

Figure 1A:
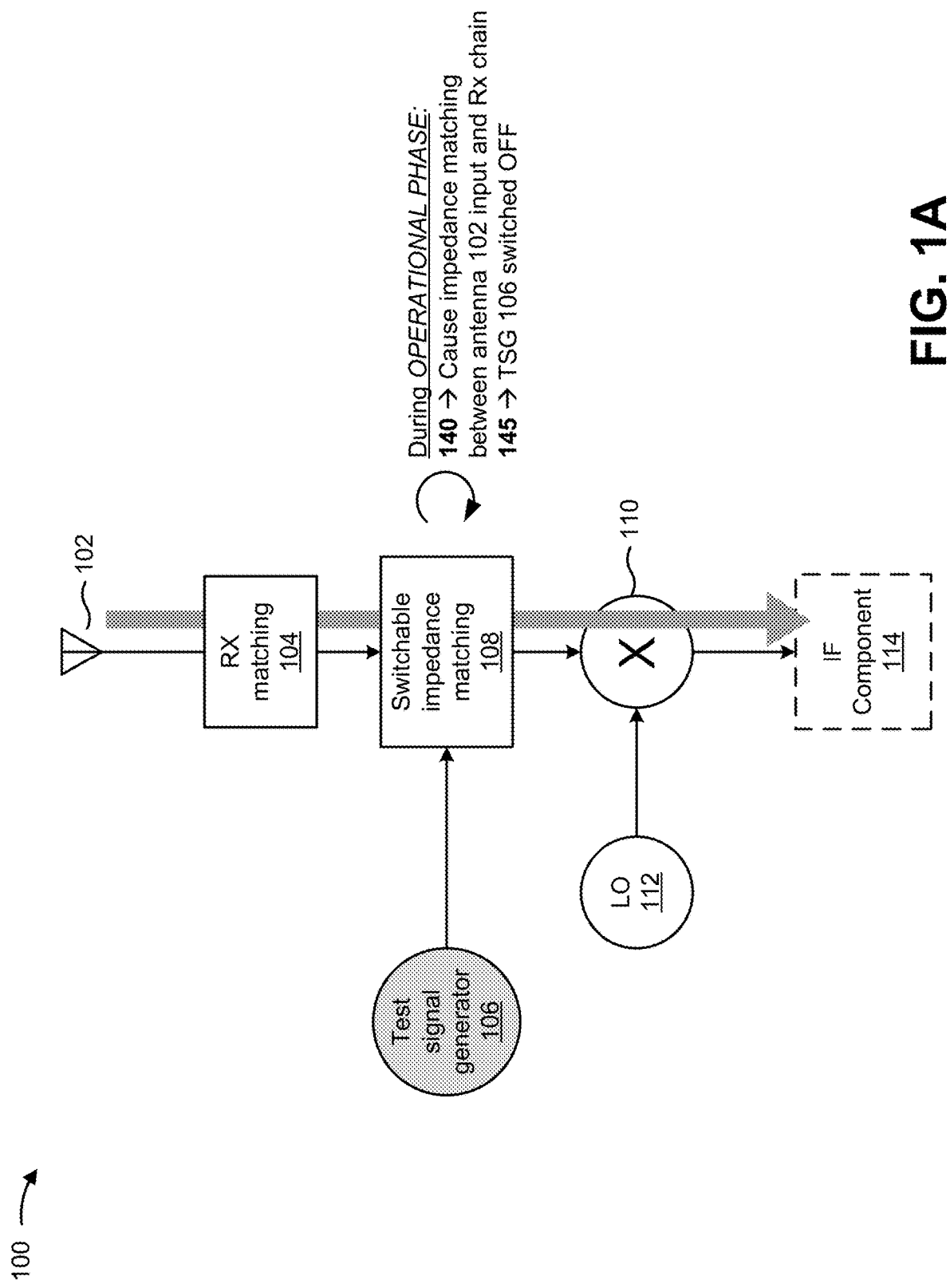

The following detailed description of example implementations refers to the accompanying drawings. The same reference numbers in different drawings may identify the same or similar elements.

As described above, an RF device (e.g., a radar MMIC) may use an RX monitoring procedure to verify that components of an RX chain of the RF device are operating in accordance with an applicable specification. However, as noted above, external distortions received via an antenna of the RF device may corrupt a result of the RX monitoring procedure. That is, external distortions received via the antenna of the RF device may affect measurements performed during the RX monitoring procedure and, therefore, impact reliability of the RX monitoring procedure.

One technique for resolving the issue of these external distortions is to disconnect the antenna from the other components of the RX chain when performing the RX monitoring, to eliminate the effect of any external distortions on the RX monitoring. This technique may be implemented using, for example, a switch (e.g., arranged before or after an RX impedance matching component on an RF signal path) that isolates the RX chain from the source of the external distortions (i.e., the antenna). The antenna can then be reconnected to the RX chain after the RX monitoring procedure is complete. However, while this technique may provide improved isolation from external distortions received via the antenna, this technique may not meet a safety standard since monitoring whether the antenna is correctly reconnected to the RX chain after the RX monitoring is finished is not possible. For example, when this technique is implemented using a switch, as described above, it is not possible to verify that the switch returns to a position in which the antenna is connected to the RX chain after the RX monitoring is finished.

Some implementations described herein provide an improved RF device that achieves safety compliant RX monitoring. In some implementations, the safety compliant RX monitoring is provided based on including a single additional component in the RF device, namely a switchable impedance matching circuit.

In some implementations, the switchable impedance matching circuit causes impedance matching between a test signal generator and (one or more components of) the RX chain to be increased during an RX chain monitoring phase associated with monitoring the RX chain of the device. The increased impedance matching between the test signal generator and the RX chain enables measurements based on a test signal generated by the test signal generator. Conversely, the switchable impedance matching circuit may cause impedance mismatching between an antenna input and the RX chain during the RX chain monitoring phase. The impedance mismatching between the antenna input and the RX chain during the RX chain monitoring phase provides isolation of the RX chain from the antenna, thereby preventing external distortions from impacting RX monitoring.

Additionally, the switchable impedance matching circuit may cause a partial impedance mismatching between the test signal generator and the RX chain during a verification phase. The verification phase may be associated with verifying a return of the switchable impedance matching circuit to causing an impedance matching between the antenna input and the RX chain. That is, the verification phase may be associated with verifying that the antenna has been reconnected to the RX chain such that the RF device can resume normal operation. Additional example implementation details are described below.

The switchable impedance matching circuit described herein allows all components of the RX chain to be monitored during the RX chain monitoring phase, while enabling detection of whether the antenna has been reconnected to the RX chain after RX monitoring is finished. As a result, safety compliant RX monitoring is achieved. Further, the switchable impedance matching circuit may be implemented as single component and, therefore, can provide safety compliant RX monitoring without a significant impact on chip space or cost.

Additionally, as described above, an RF device typically determines whether an RF ball of the RF device is connected to a PCB of the RF device in association with evaluating a connection of an antenna on an RX path. However, the ball break detection procedure has a number of shortcomings. These shortcomings include an inability to detect a partially broken RF ball, an inability to detect a partially broken connection between the RF ball and the antenna, an inability to evaluate a connection from the RF ball through to the antenna, an inability to detect a disconnection of the antenna, an inability to detect a parasitic connection associated with the antenna (e.g., a short to ground), and an inability to determine whether the antenna is strongly mismatched (even though the antenna may be connected).

Some implementations described herein provide an improved RF device that achieves RX antenna monitoring. In some implementations, the RX antenna monitoring is provided based on including a single additional component in the RF device, namely another switchable impedance matching circuit.

In some implementations, this switchable impedance matching circuit may be coupled to the test signal generator and to the receive chain to cause an impedance matching between the test signal generator and (one or more components of) the receive chain to depend on an impedance of the antenna in an antenna monitoring phase associated with determining an impedance mismatching of the antenna. The impedance mismatching of the antenna in the antenna monitoring phase can be determined based at least in part on an output signal during the antenna monitoring phase, and can be used to verify a connection of the antenna (e.g., to a MMIC), to detect a ball break or a partial ball break associated with a connection of the antenna, to detect a parasitic connection associated with the antenna, to determine a quality of impedance matching of the antenna, and/or the like. In some implementations, verification of proper operation of the switchable impedance matching circuit can be performed in the verification phase. Additional details are provided below.

In some implementations, the RF device may include the switchable impedance matching circuit in association with providing safety compliant RX monitoring, as well as the switchable impedance matching circuit associated with providing RX antenna monitoring, as described in further detail below.

Notably, details of example implementations associated with the switchable impedance matching circuit for providing safety compliant RX monitoring are provided first, followed by details of example implementations associated with the switchable impedance matching circuit for providing RX antenna monitoring.

FIGS. 1A-1C are diagrams of an example implementation associated with an RF device (herein referred to as device 100) described herein. As shown in FIG. 1A, in some implementations, device 100 may include an antenna 102, an RX matching component 104, a test signal generator 106, a switchable impedance matching circuit 108, a mixer 110, a local oscillator (LO) 112, and an intermediate frequency (IF) component 114. In some implementations, the RX chain of device 100 may include RX matching component 104, mixer 110, LO 112, IF component 114, and/or one or more other types of RX chain components not illustrated in FIG. 1. The components of device 100 are described as follows, followed by a description of an example operation of device 100 in association with performing safety compliant RX monitoring.

Antenna 102 includes an antenna to receive radio waves and produce an electrical signal (i.e., an RF signal). Antenna 102 may be coupled to input (herein referred to as an input of antenna 102) that enables the RF signal to be provided to the RX chain of device 100 for further signal processing.

RX matching component 104 includes a component to provide antenna matching associated with antenna 102 of device 100. For example, when antenna 102 has a lower impedance (e.g., 50 Ohms) and mixer 110 has a high impedance (e.g., 100 Ohms), RX matching component 104 may provide impedance matching from the low impedance to the relatively high impedance. In some implementations, RX matching component 104 may be a component in the RX chain of device 100.

Test signal generator 106 includes a component capable of generating a test signal based on which RX monitoring can be performed, as described herein. In some implementations, test signal generator 106 may be selectively switched on (to provide the test signal) or off (such that test signal generator 106 does not provide the test signal), as described herein. In some implementations, the test signal generated by test signal generator 106 may be an RF signal.

Switchable impedance matching circuit 108 (also referred to herein as a mismatching switch) includes a component capable of providing safety compliant RX monitoring. For example, switchable impedance matching circuit 108 may cause an impedance matching between test signal generator 106 and the RX chain (e.g., at least one component of the RX chain) to be increased during an RX chain monitoring phase, may cause a partial impedance mismatching between test signal generator 106 and the RX chain (e.g., the at least one component of the RX chain) during a verification phase, may cause an impedance mismatching between the input of antenna 102 and an input of the RX chain during the RX chain monitoring phase, and/or may cause an impedance matching between the input of antenna 102 and the input of the RX chain during the operational phase. In some implementations, switchable impedance matching circuit 108 may include a single component, such as a diode, a metal-oxide-semiconductor (MOS) transistor, an n-type MOS (NMOS) transistor, a p-type MOS (PMOS) transistor, or another type of switchable element.

Mixer 110 includes a component to mix an RF signal with an LO signal in association with performing frequency conversion of the RF signal to another frequency, such as an intermediate frequency (IF) (e.g., by multiplying the RF signal and the LO signal). In some implementations, mixer 110 may convert the RF signal to an IF signal to enable further signal processing by IF component 114.

LO 112 includes an oscillator that provides the LO signal for mixing by mixer 110. In some implementations, LO 112 may be coupled to mixer 110 such that mixer 110 can use the LO signal to convert the frequency of the RF signal to the IF signal, as described above.

IF component 114 includes one or more components associated with processing an IF signal generated by mixer 110. For example, IF component 114 may include an analog front end (AFE), one or more analog-to-digital converters (ADCs), a digital front end (DFE), and/or the like. In some implementations, the AFE may filter and/or process the IF signal to create an amplified and filtered IF signal for conversion by the one or more ADCs. The one or more ADCs may convert the amplified/filtered IF signal from the analog domain to the digital domain. The DFE may process a digital signal provided by the one or more ADCs, and output a processed digital signal.

In some implementations, device 100 may further include or be coupled to a control circuit associated with verifying operation of switchable impedance matching circuit 108 during the verification phase and/or one or more other operations. The control circuit may, for example, verify the operation of switchable impedance matching circuit 108 based on detecting, during the verification phase, a characteristic of the test signal generated by test signal generator 106. In some implementations, the control circuit may be included in IF component 114. As another example, the control circuit may verify that test generator 106 has been switched off or is undamaged based on, for example a characteristic of the test signal.

An example operation of device 100 is illustrated in FIGS. 1A-1C. As shown in FIG. 1A by reference number 140, during an operational phase (i.e., when device 100 is operating normally), switchable impedance matching circuit 108 may cause an impedance matching between an input of antenna 102 and an input of the RX chain of device 100. As indicated by the gray arrow in FIG. 1A, the impedance matching between the input of antenna 102 and the input of the RX chain allows the signal at antenna 102 to be processed by the components of the RX chain (e.g., RX matching component 104, mixer 110, and IF component 114). In some implementations, an impedance matching may be a matching that provides than a return loss less than −10 decibels (dB). As shown by reference number 145, during the operational phase, test signal generator 106 may be powered off (e.g., such that test signal generator 106 does not provide a test signal). In some implementations, switchable impedance matching circuit 108 may cause an impedance matching between test signal generator 106 and the RX chain.

In some implementations, device 100 may switch from a normal operation mode to a monitoring mode (e.g., when the operational phase is finished). In other words, the RX chain monitoring phase may follow the operational phase. The RX chain monitoring phase is a phase during which device 100 performs monitoring, testing, checking, or the like, of one or more components of the RX chain. In some implementations, switchable impedance matching circuit 108 may include a switch coupled to a control signal generator that provides a signal in association with controlling switchable impedance matching circuit 108. Here, the switch may be used to cause control signal generator to provide a signal that causes switchable impedance matching circuit 108 to enable normal operation (e.g., during the operational phase), RX monitoring (e.g., during the RX chain monitoring phase), or verification (e.g., during a verification phase), as described herein. In some implementations, test signal generator 106 may be switched on prior to or at a start of the RX chain monitoring phase. A switching state of switchable impedance matching circuit 108 during the RX chain monitoring phase may be referred to herein as a first switching state.

As shown in FIG. 1B by reference number 150, during the RX chain monitoring phase (i.e., when device 100 is performing measurements associated with RX monitoring), switchable impedance matching circuit 108 may cause an impedance matching between test signal generator 106 and the RX chain (e.g., one or more components of the RX chain) to be increased. Here, the impedance matching between test signal generator 106 and the RX chain is increased relative to the impedance matching between test signal generator 106 and the RX chain during the operational phase (i.e., such that the impedance matching between test signal generator 106 and the RX chain during the RX chain monitoring phase is better than the impedance matching between the test signal generator 106 and the RX chain during the operational phase). In some implementations, the impedance matching between test signal generator 106 and the RX chain during the RX chain monitoring phase may have a slight impedance mismatch (while still being comparatively improved). As indicated by the gray arrow in FIG. 1B, the impedance matching between test signal generator 106 and the RX chain during the RX chain monitoring phase enables one or more measurements based on the test signal generated by test signal generator 106. As shown by reference number 155, during the RX chain monitoring phase, switchable impedance matching circuit 108 may further cause an impedance mismatching between the input of antenna 102 and the input of the RX chain. As indicated by the gray "X" at the top of FIG. 1B, the impedance mismatching between the input of antenna 102 and the input of the RX chain may provide substantial isolation (e.g., 10 dB or better isolation) of antenna 102 from the RX chain, thereby preventing external distortions from impacting measurements performed based on the test signal during the RX chain monitoring phase.

In some implementations, device 100 may switch from the monitoring mode to a verification mode (e.g., when the RX chain monitoring phase is finished). In other words, the verification phase may follow the RX chain monitoring phase. The verification phase is a phase during which device 100 verifies a return of switchable impedance matching circuit 108 to providing an impedance matching caused during the operational phase (i.e., a verification that switchable impedance matching circuit 108 has returned to a configuration that provides normal operation of device 100). In some implementations, the switch coupled to the control circuit generator may cause a signal, associated with causing device 100 to operate in the verification phase, to be provided to switchable impedance matching circuit 108. A switching state of switchable impedance matching circuit 108 during the verification phase may be referred to herein as a second switching state.

As shown in FIG. 1C by reference number 160, during the verification phase, switchable impedance matching circuit 108 may cause a partial impedance mismatching between test signal generator 106 and the RX chain (e.g., at least one component of the RX chain). As indicated by the comparatively thin gray arrow in FIG. 1C, the partial impedance matching between test signal generator 106 and the RX chain provides limited isolation of test signal generator 106 from the RX chain. As shown by reference number 165, during the verification phase, switchable impedance matching circuit 108 may cause the impedance matching between the input of antenna 102 and the input of the RX chain (i.e., the impedance matching between the input of antenna 102 and the input of the RX chain as described above in association with FIG. 1A). As indicated by the comparatively thick gray arrow in FIG. 1C, the impedance matching between the input of antenna 102 and the input of the RX chain prevents isolation of antenna 102 from the RX chain. In other words, during the verification phase, switchable impedance matching circuit 108 may discontinue isolation of the input of antenna 102 from the input of the RX chain, while also providing limited isolation of test signal generator 106 from the RX chain.

In some aspects, a control circuit included in or connected to device 100 (e.g., included in IF component 114) may verify operation of the returning of switchable impedance matching circuit 108 in the verification phase. For example, the control circuit may verify the operation of the returning of switchable impedance matching circuit 108 based on detecting, during the verification phase, at least one characteristic (e.g., an output signal level) of the test signal from test signal generator 106. In some implementations, in association with performing this verification, the control circuit may determine a first output signal level associated with monitoring the RX chain (e.g., one or more components of the RX chain) during the RX chain monitoring phase. The first output signal level may be a level of the test signal during the RX chain monitoring phase. The control circuit may then determine a second output signal level during the verification phase. The second output signal level may be a level of the test signal during the verification phase. Here, the control circuit may verify the returning of switchable impedance matching circuit 108 based on the first output signal level and the second output signal level (e.g., based on determining that the second signal level is lower than the first signal level by a particular amount). For example, in case of a successful switch back of switchable impedance matching circuit 108 (e.g., to a position needed for normal operation) the first output signal level (e.g., between approximately 6 dB and 8 dB) may differ from the second output signal level by a known, predictable, or expected amount. This difference in output signal level may be used to verify that the circuitry of device 100 has returned to normal operation conditions. Put another way, the partial impedance mismatch enables determination of whether the test signal is at a predictable level (e.g., 5 dB, 6 dB). Further, in some implementations, the control circuit may detect whether test signal generator 106 is switched off and/or is damaged based at least in part on an output signal level. If the test signal were completely mismatched (rather than being partially mismatched), distinguishing the test signal would not be possible and, therefore, verification that switchable impedance matching circuit 108 has returned to an operational position, or detection that test signal generator 106 is switched off or is damaged, would not be possible.

In some implementations, when the verification phase is finished, device 100 may switch from the verification mode to the normal operation mode (i.e., another operational phase may begin). In some implementations, after the verification phase, test signal generator 106 may be powered off (e.g., based on a control signal, after a predetermined amount of time, and/or the like).

As indicated above, FIGS. 1A-1C are provided merely as one or more examples. Other examples may differ from what is described with regard to FIGS. 1A-1C. Further, the number and arrangement of components shown in FIGS. 1A-1C are provided as one or more examples. In practice, there may be additional components, fewer components, different components, or differently arranged components than those shown in FIGS. 1A-1C. Furthermore, two or more components shown in FIGS. 1A-1C may be implemented within a single component, or a single component shown in FIGS. 1A-1C may be implemented as multiple, distributed components. Additionally, or alternatively, a set of components (e.g., one or more components) of device 100 may perform one or more functions described as being performed by another set of components of device 100.

Figure 2:
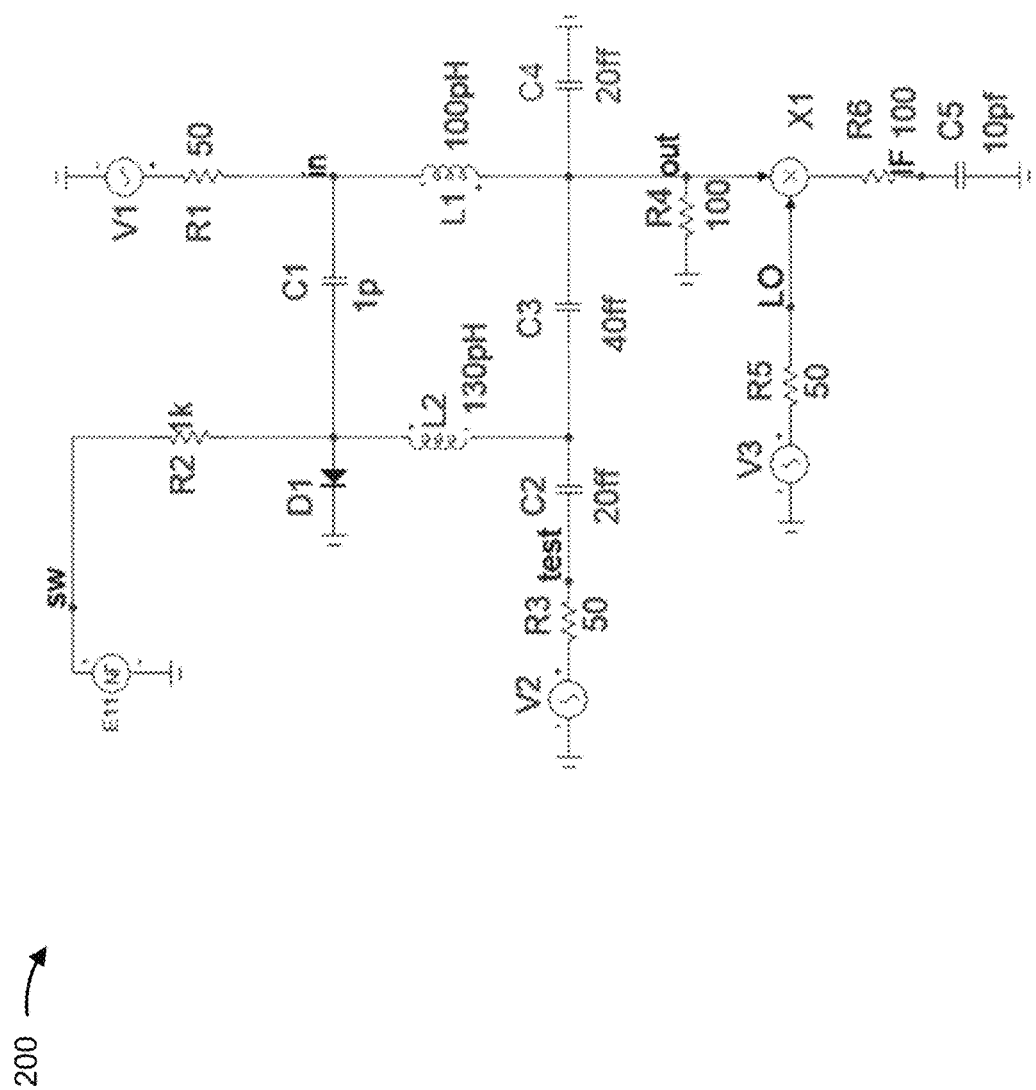
FIG. 2 is a diagram of an example implementation of the switchable impedance matching circuit shown in FIGS. 1A-1C.

FIG. 2 is a diagram of an example implementation 200 of switchable impedance matching circuit 108 shown in FIGS. 1A-1C. In example implementation 200, component V1 represents antenna 102. The RF signal received at component V1 passes through RX matching component 104, which is represented collectively by component L1 and capacitor C4, to mixer 110, which is represented by component X1. In this example, mixer 110 has an impedance of 100 Ohms and, therefore, components L1 and C4 provide impedance matching from 50 Ohms to 100 Ohms.

Test signal generator 106 is represented by component V2 and may further include capacitor C3. In example implementation 200, a test signal generated by component V2 is also matched from 50 Ohms to 100 Ohms. The test signal can be used for RX monitoring purposes, as described herein. LO 112 is represented by component V3. Antenna 102, test signal generator 106, and LO 112 are shown as having source impedances of 50 Ohms (shown as resistors R1, R3, and R5). These are for simulation purposes and may not be parts of an actual schematic.

In example implementation 200, switchable impedance matching circuit 108 is represented by diode D1 and matching components C1, C2, and L2. Diode D1 may be switched on and off by a control signal provided by component E11 (e.g., a control signal generator). Thus, the control signal may be used to cause device 100 to operate in the RX chain monitoring phase, the verification phase, or the operational phase, as described herein. When activated by the control signal, diode D1 provides impedance mismatching between the input of component V1 (i.e., antenna 102) through component C1 while, at the same time, providing impedance matching of the test signal through component L2. Thus, in some implementations, the components C1, C2, and L2 can provide an impedance mismatching between an input of antenna 102 and the RX chain during the RX chain monitoring phase, partial impedance mismatching between test signal generator 106 and the RX chain during the verification phase, and impedance matching between test signal generator 106 and the RX chain during the RX chain monitoring phase, as described herein.

The number and arrangement of components shown in FIG. 2 are provided as an example. In practice, switchable impedance matching circuit 108 may include additional components, fewer components, different components, or differently arranged components than those shown in FIG. 2. Additionally, or alternatively, a set of components (e.g., one or more components) of switchable impedance matching circuit 108 may perform one or more functions described as being performed by another set of components of switchable impedance matching circuit 108.

Figure 3A:
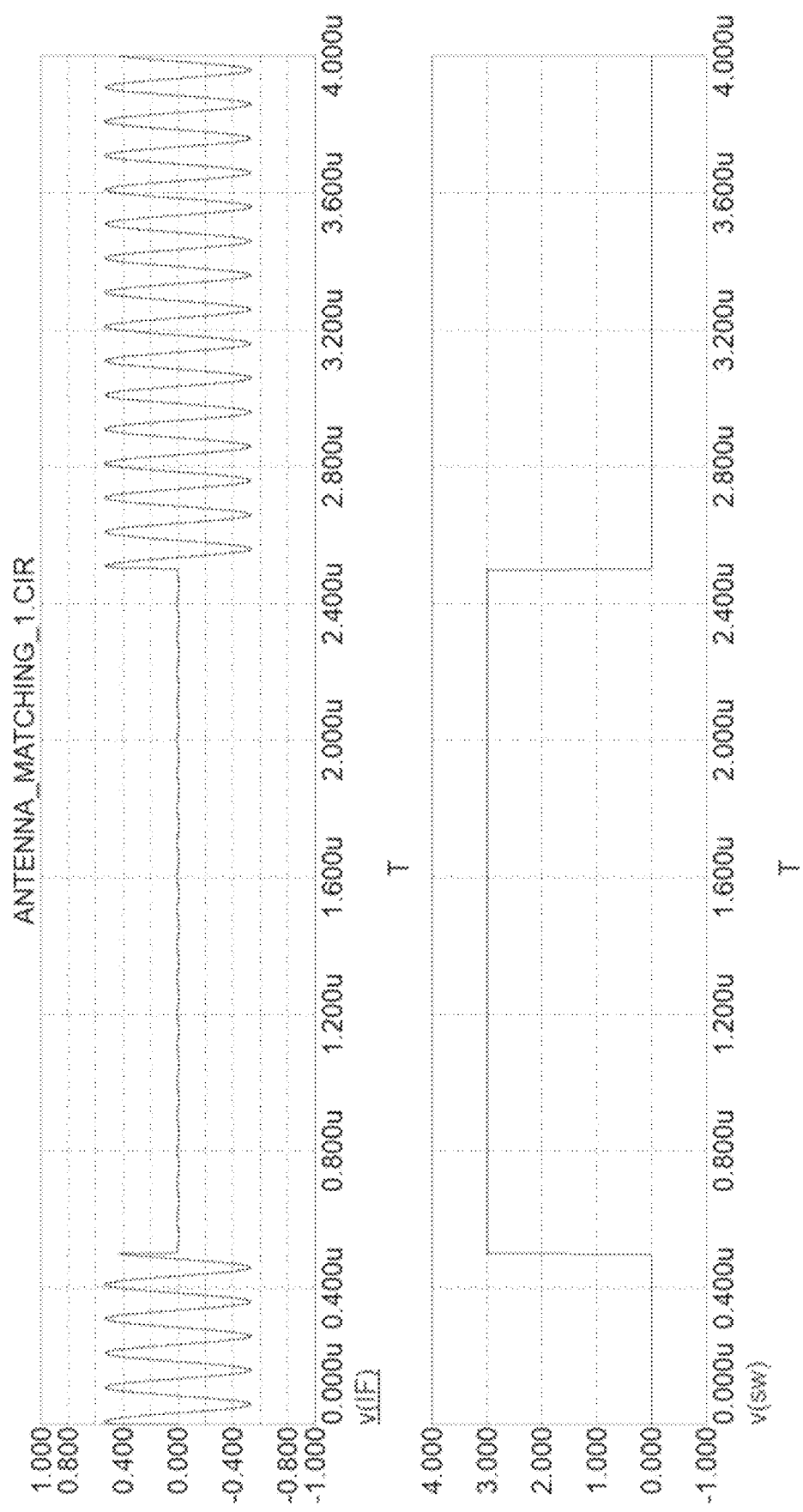
FIGS. 3A and 3B are diagrams of illustrative examples of output signal levels used for verifying operation of a switchable impedance matching circuit described herein.
Figure 3B:
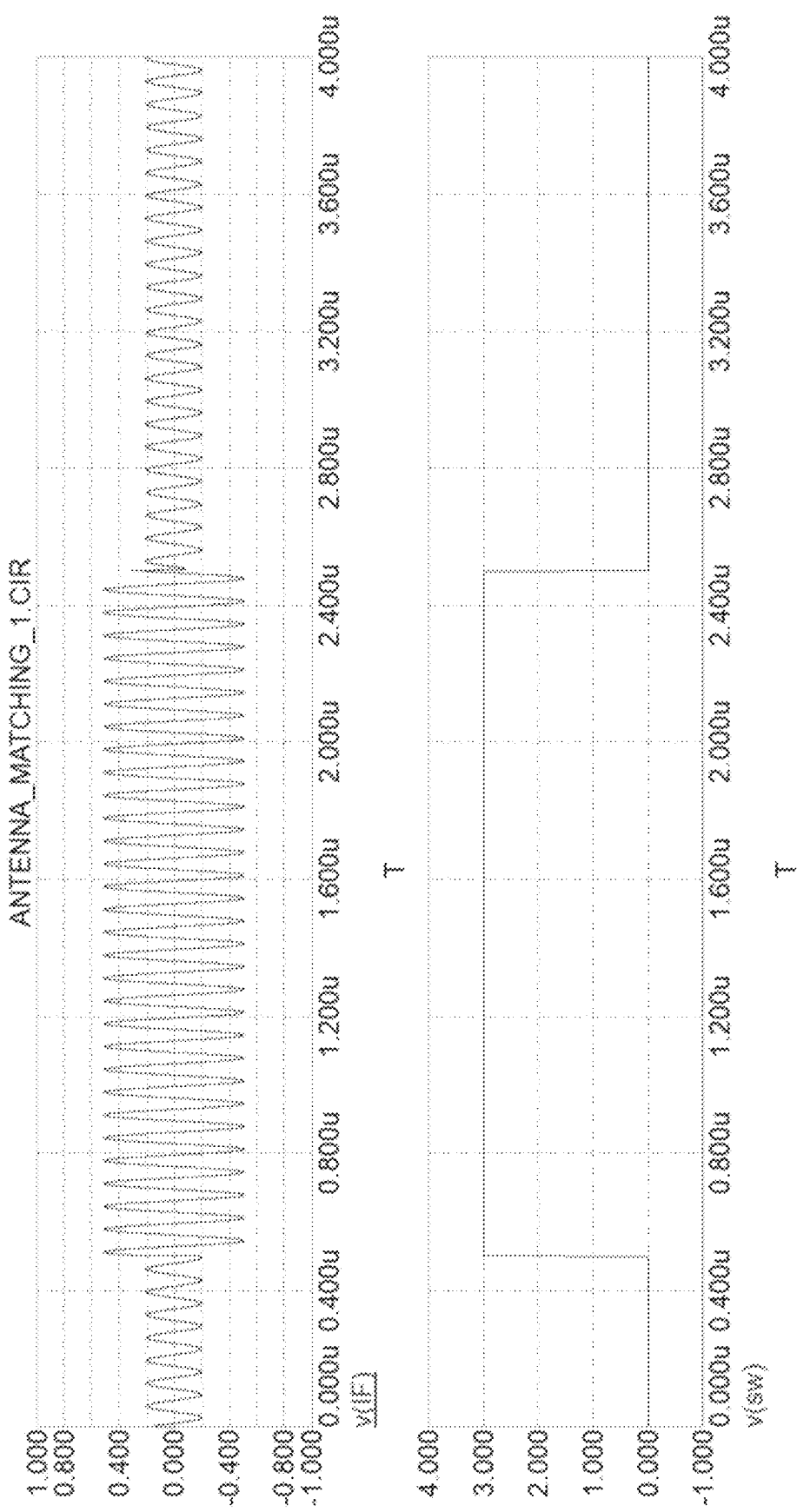

FIGS. 3A and 3B are diagrams of illustrative examples of output signal levels during phases of operation of device 100, as described herein.

FIG. 3A is a diagram illustrating mismatching of the input of antenna 102 during the RX chain monitoring phase, as described herein. As illustrated in the lower diagram of FIG. 3A, a control signal may, at a start of the RX chain monitoring phase, change from a first level (e.g., 0 volts (V)) to a second level (e.g., 3 V). This control signal may cause switchable impedance matching circuit 108 to be in a first switching state in which switchable impedance matching circuit 108 provides an impedance mismatching between the input of antenna 102 and the RX chain, as described above. As shown in the upper diagram of FIG. 3A, in this example, the RF signal from antenna 102 drops (e.g., from approximately 20 dB to approximately 0 dB). This illustrates that antenna 102 is well mismatched during the RX chain monitoring phase. As further shown in the lower diagram of FIG. 3A, the control signal may, at an end of the RX chain monitoring phase, change from the second level to the first level. As further illustrated in the upper diagram of FIG. 3A, this may cause switchable impedance matching circuit 108 to be in the second switching state in which switchable impedance matching circuit 108 provides an impedance matching between the input of antenna 102 and the RX chain, as described above.

FIG. 3B is a diagram illustrating partial impedance matching and increased impedance matching of test signal generator 106 as described herein. As illustrated in the lower diagram of FIG. 3B, when the control signal changes from the first level to the second level at the start of the RX chain monitoring phase, such that switchable impedance matching circuit 108 is in the first switching state, switchable impedance matching circuit 108 provides an increased impedance mismatching between test signal generator 106 and the RX chain, as described above. As illustrated by the relative output signals in the upper diagram of FIG. 3B, this increase is relative to the impedance matching between test signal generator 106 and the RX chain prior to switchable impedance matching circuit 108 being in the first switching state. As further shown in the upper diagram of FIG. 3B, in this example, the test signal from test signal generator 106 increases. This illustrates that test signal generator 106 has an increased impedance matching during the RX chain monitoring phase. As further shown in the lower diagram of FIG. 3B, the control signal may, at an end of the RX chain monitoring phase, change from the second level to the first level. As further illustrated in the upper diagram of FIG. 3B, this may cause switchable impedance matching circuit 108 to be in the second switching state, in which switchable impedance matching circuit 108 provides the comparatively decreased impedance matching between test signal generator 106 and the RX chain, as described above. Here, test signal generator 106 may remain powered on to allow operation of switchable impedance matching circuit 108 to be verified during the verification phase. In some implementations, the output signal level of test signal generator 106 may be used in association with verifying operation of switchable impedance matching circuit 108. For example, the control circuit may determine that the output signal level changes from a comparatively higher level during the RX chain monitoring phase to a comparatively lower level (e.g., a previously observed level), thereby ensuring a successful switch back of switchable impedance matching circuit 108.

As indicated above, FIGS. 3A and 3B are provided merely as examples. Other examples may differ from what is described with regard to FIGS. 3A and 3B.

Figure 4:
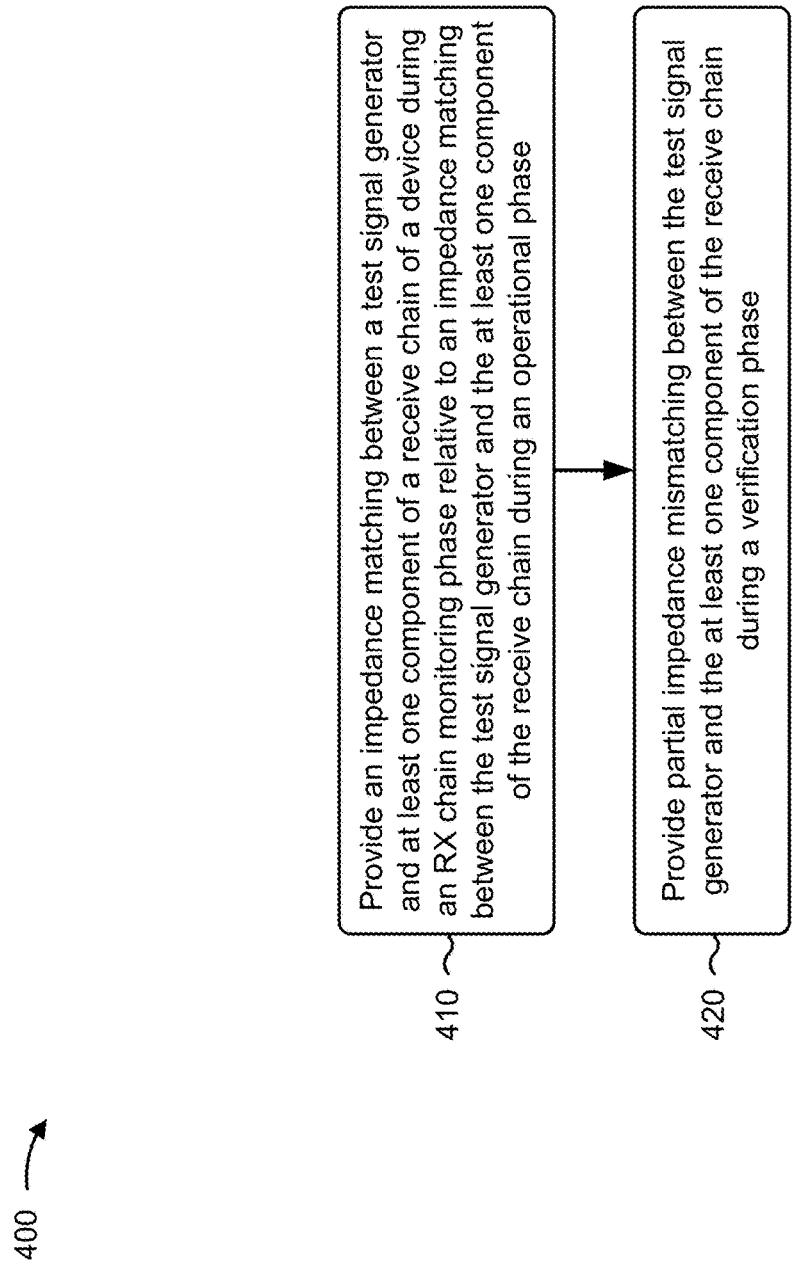

FIG. 4 is a flow chart of an example process 400 associated with safety compliant RX monitoring. In some implementations, one or more process blocks of FIG. 4 may be performed by one or more components of FIGS. 1A-C (e.g., switchable impedance matching circuit device 108).

As shown in FIG. 4, process 400 may include providing an impedance matching between a test signal generator and at least one component of a receive chain of a device during an RX chain monitoring phase, relative to an impedance matching between the test signal generator and the at least one component of the receive chain during an operational phase (block 410). For example, a switchable impedance matching circuit (e.g., switchable impedance matching circuit 108) may provide an impedance matching between a test signal generator (e.g., test signal generator 106) and at least one component of a receive chain of a device (e.g., device 100) during an RX chain monitoring phase relative to an impedance matching between the test signal generator and the at least one component of the receive chain during an operational phase, as described above. In some aspects, the RX chain monitoring phase is associated with monitoring one or more components of the receive chain of the device. In some aspects, the impedance matching during the RX chain monitoring phase enables one or more measurements based on a test signal generated by the test signal generator.

As further shown in FIG. 4, process 400 may include providing partial impedance mismatching between the test signal generator and the at least one component of the receive chain during a verification phase (block 420). For example, the switchable impedance matching circuit may provide partial impedance mismatching between the test signal generator and the at least one component of the receive chain during a verification phase, as described above. In some aspects, the verification phase is associated with verifying a return of the switchable impedance matching circuit to an impedance matching caused during the operational phase.

Process 400 may include additional implementations, such as any single implementation or any combination of implementations described below and/or in connection with one or more other processes described elsewhere herein.

In some implementations, a control circuit (e.g., included in or communicatively coupled to IF component 114) may verify the return of a switchable impedance matching circuit (e.g., switchable impedance matching circuit 108) based on detecting, during the verification phase, at least one characteristic of the test signal.

In some implementations, the switchable impedance matching circuit may provide an impedance mismatching between a receive antenna input of the device and an input of the receive chain during the RX chain monitoring phase. Here, the impedance mismatching between the receive antenna input and the input of the receive chain may substantially isolate the input of the receive chain from the receive antenna input.

In some implementations, the switchable impedance matching circuit may provide an impedance matching between a receive antenna input of the device and an input of the receive chain during the operational phase.

In some implementations, the test signal generator may be powered off after the verification phase is finished.

In some implementations, a signal may be provided to the switchable impedance matching circuit in association with controlling the switchable impedance matching circuit.

In some implementations, the device forms at least part of a radar MMIC.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

FIG. 5 is a flow chart of an example process 500 associated with safety compliant RX monitoring. In some implementations, one or more process blocks of FIG. 5 may be performed by one or more components of FIG. 1 (e.g., a control circuit included in or communicatively coupled to IF component 114).

As shown in FIG. 5, process 500 may include determining a first output signal level during an RX chain monitoring phase associated with monitoring one or more components of a receive chain of a device (block 510). For example, the control circuit may determine a first output signal level during an RX chain monitoring phase associated with monitoring one or more components of a receive chain of a device (e.g., device 100), as described above. In some aspects, impedance matching between a test signal generator (e.g., test signal generator 106) and the one or more components of the receive chain is provided by a switchable impedance matching circuit (e.g., switchable impedance matching circuit 108) during the RX chain monitoring phase.

As further shown in FIG. 5, process 500 may include determining a second output signal level during a verification phase (block 520). For example, the control circuit may determine a second output signal level during a verification phase, as described above. In some aspects, partial impedance mismatching between the test signal generator and the one or more components is provided by the switchable impedance matching circuit during the verification phase.

As further shown in FIG. 5, process 500 may include verifying operation of the switchable impedance matching circuit based on the first output signal level and the second output signal level (block 530). For example, the control circuit may verify operation of the switchable impedance matching circuit based on the first output signal level and the second output signal level, as described above.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

Figure 6A:
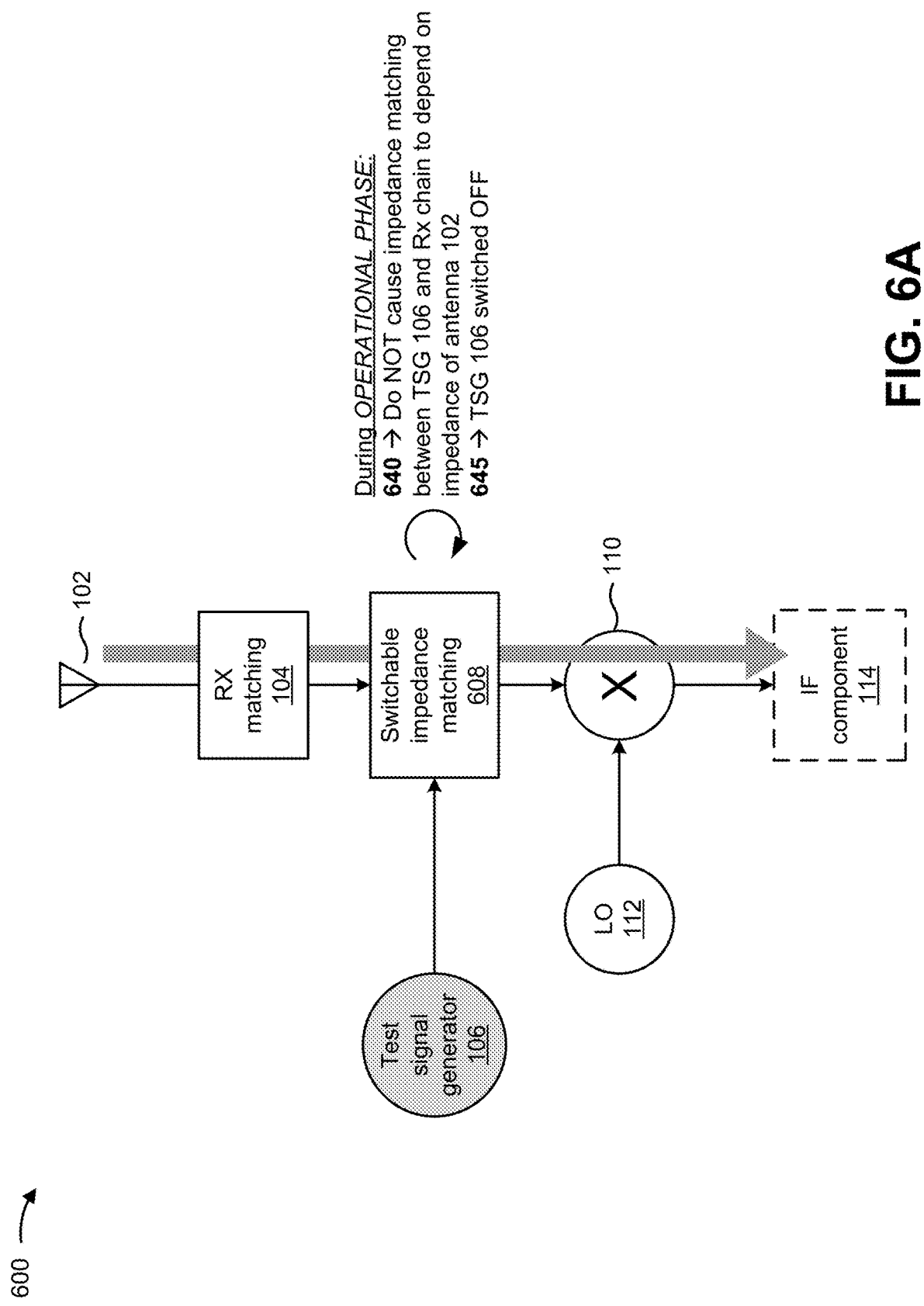
FIG. 6 is a diagram of another example implementation described herein.

In some implementations, as described above, an RF device may include a switchable impedance matching circuit associated with providing RX antenna monitoring. FIGS. 6A and 6*b* are diagrams of an example implementation associated with an RF device (herein referred to as device 600) described herein. As shown in FIGS. 6A and 6B, in some implementations, device 600 may include antenna 102, RX matching component 104, test signal generator 106, a switchable impedance matching circuit 608, mixer 110, LO 112, and IF component 114. In some implementations, the RX chain of device 600 may include RX matching component 104, mixer 110, LO 112, IF component 114, and/or one or more other types of RX chain components not illustrated in FIGS. 6A and 6B. Antenna 102, RX matching component 104, test signal generator 106, mixer 110, LO 112, and IF component 114 may be components similar to those described in association with FIGS. 1A-1C.

Switchable impedance matching circuit 608 includes a component capable of enabling RX antenna monitoring. For example, switchable impedance matching circuit 608 may cause an impedance matching between test signal generator 106 and (one or more components of) the RX chain to depend on an impedance of antenna in an antenna monitoring phase. The antenna monitoring phase is a phase during which one or more parameters of antenna 102 may be monitored, measured, detected, or otherwise determined. For example, the antenna monitoring phase may be a phase in which device 600 verifies a connection of antenna 102 (e.g., verifying that antenna 102 is connected to a MMIC), detects whether there is a ball break or a partial ball break associated with a connection of antenna 102, detects whether there is a parasitic connection associated with antenna 102 (e.g., an unwanted connection to another circuit element, such as a short to ground), determines a quality of impedance matching of antenna 102, and/or the like. In some implementations, switchable impedance matching circuit 608 may include a single component, such as a diode, a MOS transistor, an NMOS transistor, a PMOS transistor, or another type of switchable element.

In some implementations, device 600 may further include or be coupled to a control circuit associated with determining an impedance matching of antenna 102 in an antenna monitoring phase, verifying operation of switchable impedance matching circuit 608 during a verification phase, and/or performing one or more other operations associated with RX antenna monitoring. In some implementations, the control circuit may be included in IF component 114.

An example operation of device 600 is illustrated in FIGS. 6A and 6B. As shown in FIG. 6A by reference number 640, during an operational phase (i.e., when device 600 is operating normally), switchable impedance matching circuit 608 does not cause an impedance matching between test signal generator 106 and one or more components of the RX chain to depend on an impedance of antenna 102. As indicated by the gray arrow in FIG. 6A (and similar to the manner described above in association with FIG. 1A), in the operational phase, the impedance matching between the input of antenna 102 and the input of the RX chain allows the signal at antenna 102 to be processed by the components of the RX chain (e.g., RX matching component 104, mixer 110, and IF component 114). As shown by reference number 645, during the operational phase, test signal generator 106 may be powered off (e.g., such that test signal generator 106 does not provide a test signal).

In some implementations, device 600 may switch from a normal operation mode to an antenna monitoring mode (e.g., when the operational phase is finished). In other words, the antenna monitoring phase may come after the operational phase, in some implementations. The antenna monitoring phase is a phase during which device 600 determines an impedance mismatching of the receive antenna and/or performs one or more other operations in association with monitoring antenna 102. For example, as described above, the antenna monitoring phase may be a phase in which device 600 verifies a connection of antenna 102, detects whether there is a ball break or a partial ball break associated with a connection of antenna 102, detects whether there is a parasitic connection associated with antenna 102, determines a quality of impedance matching of antenna 102, and/or the like.

In some implementations, switchable impedance matching circuit 608 may include a switch coupled to a control signal generator that provides a signal in association with controlling switchable impedance matching circuit 608. Here, the switch may be used to cause the control signal generator to provide a signal that causes switchable impedance matching circuit 608 to enable normal operation (e.g., during the operational phase) or antenna monitoring (e.g., during the antenna monitoring phase), as described herein. In some implementations, test signal generator 106 may be switched on prior to or at a start of the antenna monitoring phase.

As shown in FIG. 6B by reference number 650, during the antenna monitoring phase, switchable impedance matching circuit 608 may cause an impedance matching between test signal generator 106 and the RX chain (e.g., one or more components of the RX chain) to depend on an impedance of antenna 102. As indicated by the patterned arrow in FIG. 6B, the dependence of the impedance matching between test signal generator 106 and the RX chain on the impedance of antenna 102 during the antenna monitoring phase enables measurements based on the test signal generated by test signal generator 106 to be used in association with determining an impedance matching of antenna 102 that can be used for RX antenna monitoring.

In some implementations, the control circuit may determine the impedance matching of antenna 102 based on output signal levels during the operational phase and the antenna monitoring phase. For example, the control circuit may determine a first output signal level during the operational phase. The control circuit may then determine a second output signal level during the antenna monitoring phase. Here, the control circuit may determine the impedance matching of antenna 102 based on the first output signal level and the second output signal level (e.g., based on a difference between the first output signal level and the second output signal level), a particular example of which is described below in association with FIG. 7.

As indicated above, FIGS. 6A and 6B are provided merely as one or more examples. Other examples may differ from what is described with regard to FIGS. 6A and 6B. Further, the number and arrangement of components shown in FIGS. 6A and 6B are provided as one or more examples. In practice, there may be additional components, fewer components, different components, or differently arranged components than those shown in FIGS. 6A and 6B. Furthermore, two or more components shown in FIGS. 6A and 6B may be implemented within a single component, or a single component shown in FIGS. 6A and 6B may be implemented as multiple, distributed components. Additionally, or alternatively, a set of components (e.g., one or more components) of device 600 may perform one or more functions described as being performed by another set of components of device 600.

Figure 7:
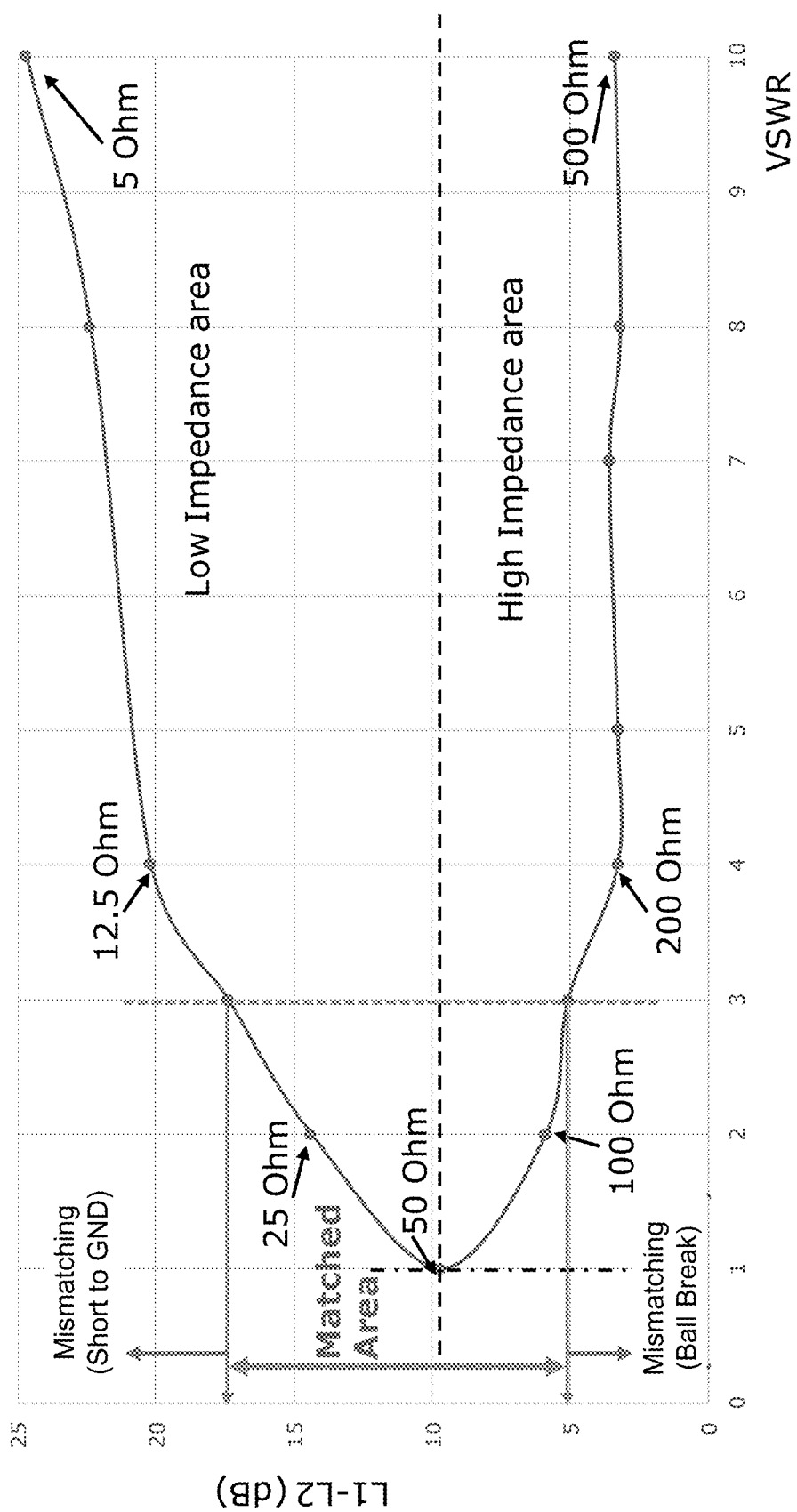
FIG. 7 is a diagram associated with determining a quality of an impedance matching of a receive antenna as described herein.

FIG. 7 is a diagram associated with a particular example associated with determining a quality of an impedance matching of antenna 102. As shown in FIG. 7, in the case of a well-matched antenna 102 the difference between the first output signal level and the second output signal level may be in an impedance matching range defined by a first value (e.g., approximately 5 dB) and a second value (e.g., approximately 16 dB). Therefore, as illustrated in FIG. 7, if the difference is within the impedance matching range (e.g., between the first and second values), then the control circuit may determine that antenna 102 is adequately connected and is well-matched. Conversely, if the difference between the first output signal level and the second output signal level is above the impedance matching range (e.g., greater than the second value, meaning that the impedance of antenna 102 is low), then the control circuit may determine that antenna 102 is not well-matched. Further, since the difference is above the impedance matching range, the control circuit may identify a possible parasitic connection (e.g., a short to ground) associated with antenna 102. Similarly, as further illustrated in FIG. 7, if the difference between the first output signal level and the second output signal level is below the impedance matching range (e.g., less than the first value, meaning that the impedance of antenna 102 is high), then the control circuit may determine that antenna 102 is not well-matched. Further, since the difference is below the impedance matching range, the control circuit may identify a possible ball break or partial ball break associated with antenna 102. Notably, in device 600, the control circuit determines the impedance mismatching of antenna 102 at a component of the RX chain that is downstream from a component of the RX chain at which the test signal generated by test signal generator 106 is injected into the RX chain.

As indicated above, FIG. 7 is provided as an example. Other examples may differ from what is described with regard to FIG. 7.

In some implementations, both switchable impedance matching circuit 108 and switchable impedance matching circuit 608 may be included in an RF device (herein referred to as device 100/600). For example, device 100/600 may include both switchable impedance matching circuit 108 and switchable impedance matching circuit 608. Therefore, in some implementations, device 100/600 may be capable of performing both RX chain monitoring and RX antenna monitoring, as described herein. In such a case, the verification phase may be associated with verifying a return of switchable impedance matching circuit 108 to an impedance matching caused in the operational phase (as described above) and verifying a return of switchable impedance matching circuit 608 to an impedance matching caused during the operational phase. In some implementations, a phase order of device 100/600 may be (1) operational phase, (2) antenna monitoring phase, (3) RX chain monitoring phase, and (4) verification phase.

Notably, in device 100/600, switchable impedance matching circuit 108 does not cause the impedance matching between test signal generator 106 and the RX chain to be increased in the antenna monitoring phase. That is, switchable impedance matching circuit 108 is in an OFF position during the antenna monitoring phase. Further, switchable impedance matching circuit 608 does not cause the impedance matching between test signal generator 106 and the RX chain to depend on the impedance of antenna 102 in the RX chain monitoring phase. That is, switchable impedance matching circuit 608 may be in an OFF position during the RX chain monitoring phase.

In some implementations, device 100/600 may be utilized in an optional confirmation phase in association with verifying operation of switchable impedance matching circuit 108. In some implementations, the confirmation phase may occur after the antenna monitoring phase and before the RX chain monitoring phase. Thus, in some implementations, a phase order of device 100/600 may be (1) operational phase, (2) antenna monitoring phase, (3) confirmation phase, (4) RX chain monitoring phase, and (5) verification phase. During the confirmation phase, switchable impedance matching circuit 608 may cause the impedance matching between test signal generator 106 and the RX chain to depend on the impedance of antenna 102, and switchable impedance matching circuit 108 may cause the impedance matching between test signal generator 106 and the RX chain to be increased. That is, switchable impedance matching circuit 108 and switchable impedance matching circuit 608 may both be in ON positions during the confirmation phase. In some implementations, the control circuit may verify operation of switchable impedance matching circuit 108 based on whether there is a difference between an output signal level during the antenna monitoring phase and an output signal level during the confirmation phase. For example, if the control circuit determines that a difference between the output signal level during the antenna monitoring phase and the output signal level during the confirmation phase satisfies a threshold (e.g., is greater than or equal to an expected difference), then the control circuit may verify operation of switchable impedance matching circuit 108 (i.e., the control circuit may verify that switchable impedance matching circuit 108 is in a ON position). Conversely, if the control circuit determines that the difference between the output signal level during the antenna monitoring phase and the output signal level during the confirmation phase does not satisfy the threshold, then the control circuit may not verify operation of switchable impedance matching circuit 108 (i.e., the control circuit may be unable to verify that switchable impedance matching circuit 108 is in the ON position).

Figure 8:
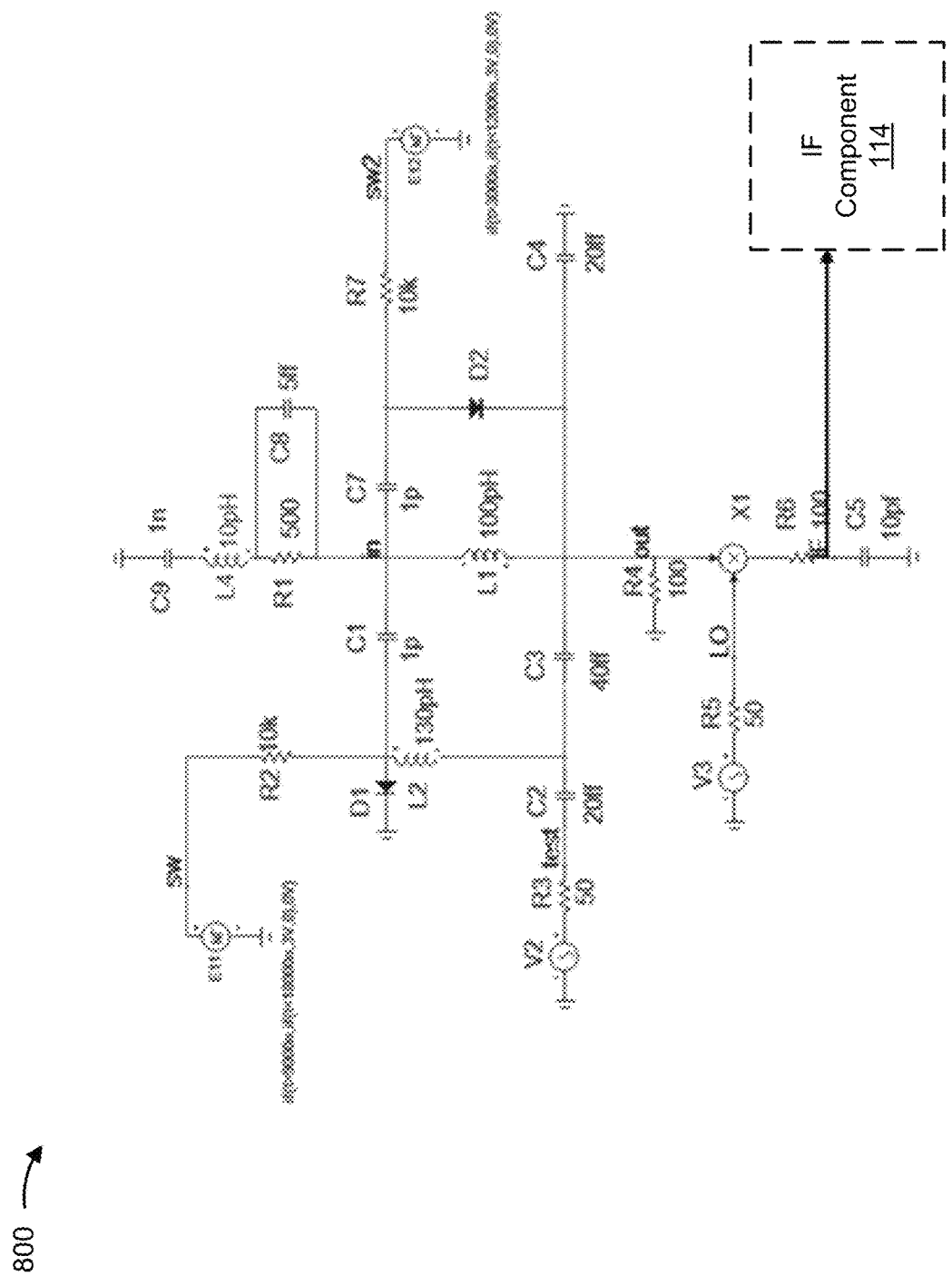
FIG. 8 is a diagram of an example implementation of the switchable impedance matching circuits shown in FIGS. 1A-1C and FIG. 6.

FIG. 8 is a diagram of an example implementation 800 of switchable impedance matching circuit 108 shown in FIGS. 1A-1C and switchable impedance matching circuit 608 shown in FIGS. 6A-6B. In example implementation 800, components C9, L4, and C8 represent antenna 102. The RF signal received at component C9 passes through RX matching component 104, which is represented collectively by component L1 and capacitor C4, to mixer 110, which is represented by component X1. In this example, mixer 110 has an impedance of 100 Ohms and, therefore, components L1 and C4 provide impedance matching from 50 Ohms to 100 Ohms.

Test signal generator 106 is represented by component V2 and may further include capacitor C3. In example implementation 800, a test signal generated by component V2 is also matched from 50 Ohms to 100 Ohms. The test signal can be used for RX antenna monitoring purposes and/or RX chain monitoring purposes, as described herein. LO 112 is represented by component V3. Antenna 102, test signal generator 106, and LO 112 are shown as having source impedances of 50 Ohms (shown as resistors R1, R3, and R5). These are for simulation purposes and may not be parts of an actual schematic.

In example implementation 800, switchable impedance matching circuit 108 is represented by diode D1 and matching components C1, C2, and L2. Diode D1 may be switched on and off by a control signal provided by component E11 (e.g., a control signal generator). Thus, the control signal may be used to cause device 100 to operate in the antenna monitoring phase, the confirmation phase, the RX chain monitoring phase, the verification phase, or the operational phase, as described herein. When activated by the control signal, diode D1 provides impedance mismatching between the input of component V1 (i.e., antenna 102) through component C1 while, at the same time, providing impedance matching of the test signal through component L2. Thus, in some implementations, the components C1, C2, and L2 can provide an impedance mismatching between an input of antenna 102 and the RX chain during the RX chain monitoring phase, partial impedance mismatching between test signal generator 106 and the RX chain during the verification phase, and impedance matching between test signal generator 106 and the RX chain during the RX chain monitoring phase, as described herein.

In example implementation 800, switchable impedance matching circuit 608 is represented by diode D2 and matching component C7. Diode D2 may be switched on and off by a control signal provided by component E12 (e.g., a control signal generator). Thus, the control signal may be used to cause device 100/600 to operate in the antenna monitoring phase, the confirmation phase, the RX chain monitoring phase, the verification phase, or the operational phase, as described herein. When activated by the control signal, diode D2 causes an impedance matching between the input of component V2 (i.e., test signal generator 106) and the RX chain to depend on impedance of antenna 102. Thus, in some implementations, the component C7 can cause the impedance matching between test signal generator 106 and the RX chain to depend on the impedance of antenna 102 during the antenna monitoring phase, as described herein.

The number and arrangement of components shown in FIG. 8 are provided as an example. In practice, switchable impedance matching circuit 108 and/or switchable impedance matching circuit 608 may include additional components, fewer components, different components, or differently arranged components than those shown in FIG. 8. Additionally, or alternatively, a set of components (e.g., one or more components) of switchable impedance matching circuit 108 and/or switchable impedance matching circuit 608 may perform one or more functions described as being performed by another set of components of switchable impedance matching circuit 108 and/or switchable impedance matching circuit 608.

Figure 9A:
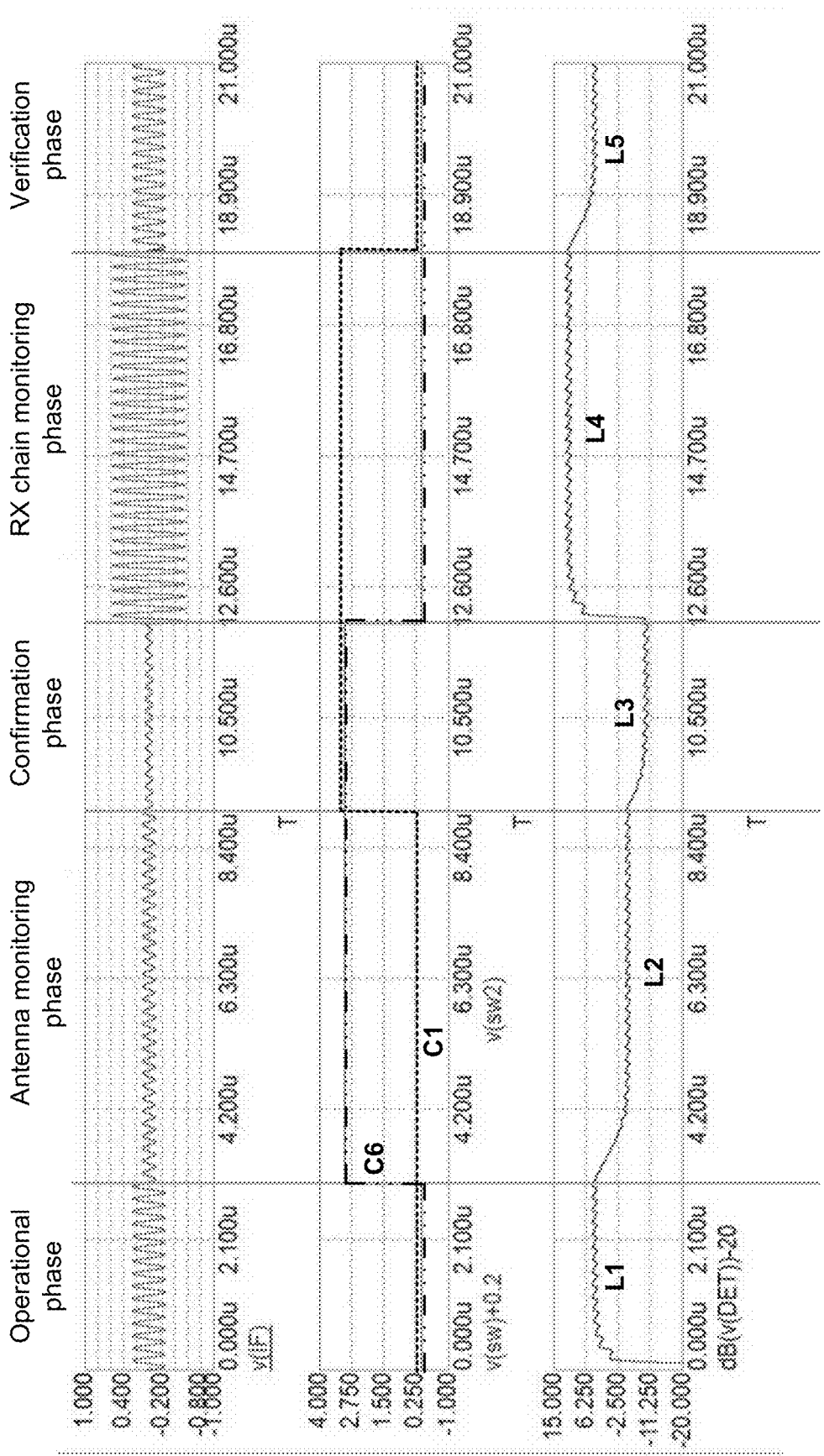
FIGS. 9A-9C are diagrams of illustrative examples associated with antenna monitoring, receive chain monitoring, and verification, as described herein.
Figure 9B:
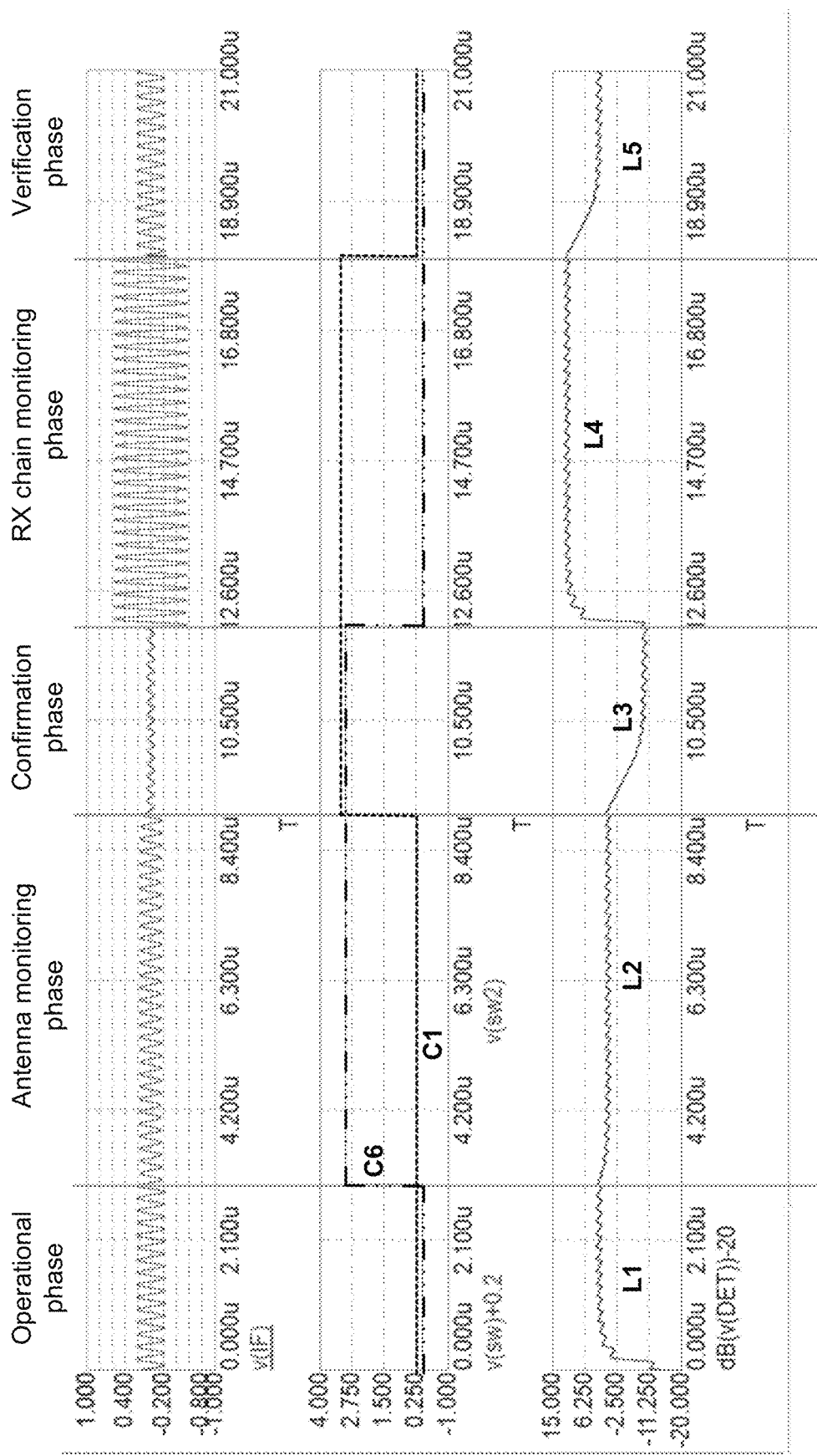
Figure 9C:
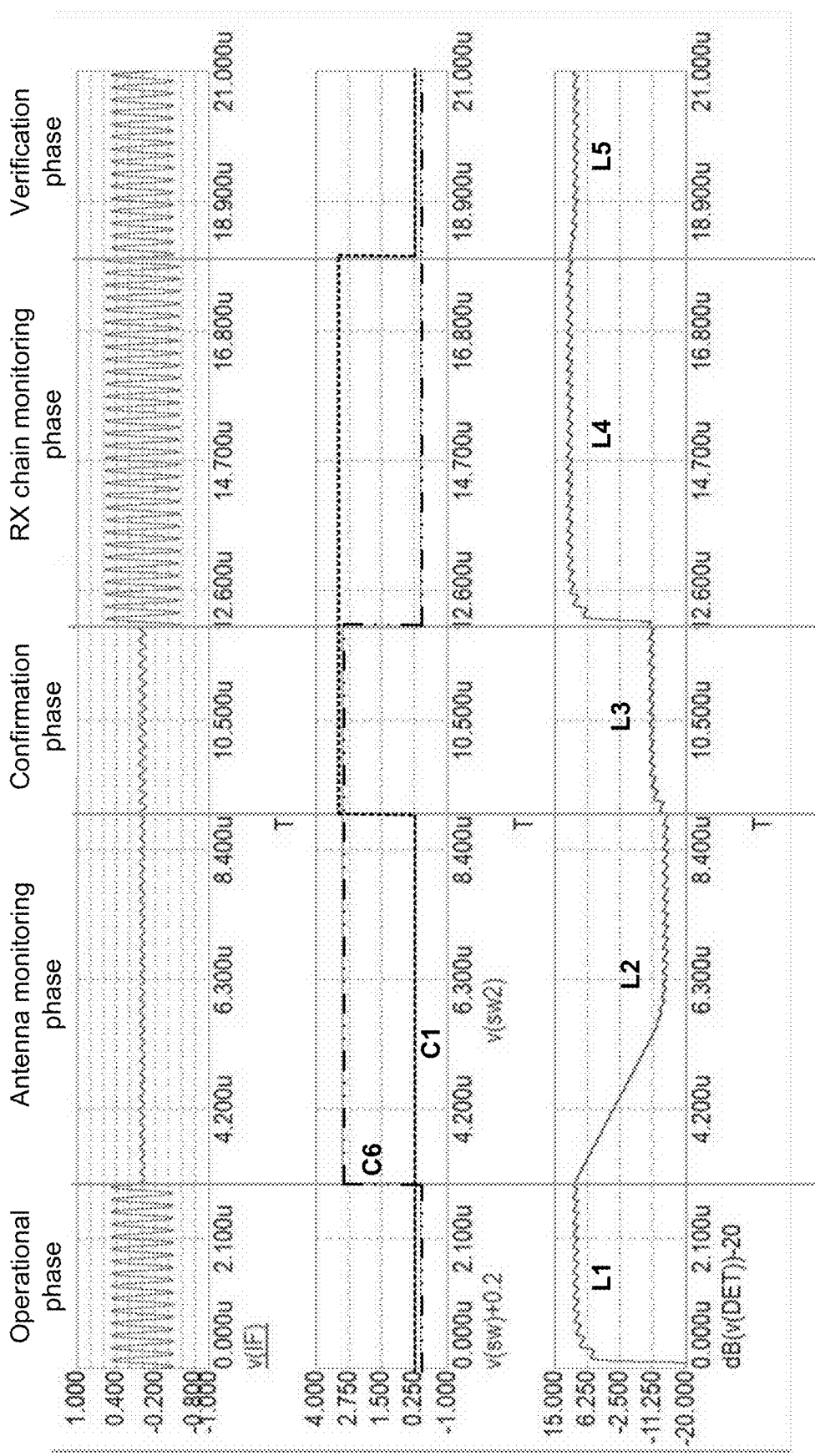

FIGS. 9A-9C are diagrams of illustrative examples associated with antenna monitoring, RX chain monitoring, and verification, as described herein. RF signals from antenna 102 after down-conversion in mixer 110 are shown in the upper diagrams of FIGS. 9A-9C, control signals associated with switchable impedance matching circuit 108 and switchable impedance matching circuit 608 are shown in the middle diagrams of FIGS. 9A-9C, and output signal levels (e.g., at IF component 114) are shown in the lower diagrams of FIGS. 9A-9C. In the examples shown in FIGS. 9A-9C, test signal generator 106 is powered on, such that test signal generator 106 provides a test signal to be used for RX antenna monitoring and/or RX chain monitoring.

As illustrated in FIGS. 9A-9C, device 100/600 may begin in an operational phase. Here, as shown by the middle diagrams, control signal C1 associated with switchable impedance matching circuit 108 and control signal C6 switchable impedance matching circuit 608 may be at a first level (e.g., approximately 0 volts (V)), meaning that both switchable impedance matching circuit 108 and switchable impedance matching circuit 608 are in an OFF state. In some implementations, the control circuit associated with device 100/600 may measure output signal level L1 during the operation phase.

As further illustrated in FIGS. 9A-9C, the control signal C6 may, at a start of the antenna monitoring phase, change from the first level to a second level (e.g., approximately 3 V). This control signal may cause switchable impedance matching circuit 608 to switch to an ON state in which switchable impedance matching circuit 608 causes an impedance matching between test signal generator 106 and the RX chain to depend on an impedance of antenna 102, as described above. In some implementations, the control circuit associated with device 100/600 may measure output signal level L2 during the antenna monitoring phase, and may determine the impedance mismatching of antenna 102 based on output signal levels L1 and L2, as described herein.

As further illustrated in FIGS. 9A-9C, the control signal C1 may, at a start of the confirmation phase, change from the first level to the second level. This control signal may cause switchable impedance matching circuit 108 to be in a switching state in which the impedance matching between test signal generator 106 and the RX chain is increased, as described above. In some implementations, the control circuit associated with device 100/600 may measure output signal level L3 during the confirmation phase, and may verify operation of switchable impedance matching circuit 108 based on output signal levels L2 and L3, as described herein. Notably, the confirmation phase is optional and, in some cases, device 100/600 may move directly from the antenna monitoring phase to the RX chain monitoring phase.

As further shown in FIGS. 9A-9C, the control signal C6 may, at an end of the confirmation phase (or at the end of the antenna monitoring phase, when the confirmation phase is not used), change from the second level to the first level, which may cause switchable impedance matching circuit 608 to return to the OFF state (e.g., such that the impedance matching between test signal generator 106 and the RX does not depend on the impedance of antenna 102), as described above.

As further illustrated in FIGS. 9A-9C, at a start of the RX chain monitoring phase, the control signal C1 remains at the second level such that switchable impedance matching circuit 108 remains in the switching state in which the impedance matching between test signal generator 106 and the RX chain is increased. In some implementations, the control circuit associated with device 100/600 may measure output signal level L4 during the RX chain monitoring phase, and may perform RX chain monitoring (e.g., based on output signal levels L1 and L4), as described herein.

As further shown, at the start of the verification phase, the control signal C1 may change from the second level to the first level. As further illustrated in FIGS. 9A-9C, this may cause switchable impedance matching circuit 108 to be in the second switching state, in which switchable impedance matching circuit 108 provides an impedance matching between the input of antenna 102 and the RX chain, as described above. In some implementations, the control circuit associated with device 100/600 may measure output signal level L5 during the verification phase, and may verify operation of switchable impedance matching circuit 108 and switchable impedance matching circuit 608 (e.g., based on output signal levels L1, L4, and/or L5), as described herein.

FIG. 9A illustrates an example in which antenna 102 is well-matched to 50 Ohms. FIG. 9B illustrates an example in which antenna 102 has a high impedance such that antenna 102 is mismatched to 500 Ohms. In FIG. 9B, this mismatching is indicated by the relatively small difference between output signal levels L1 and L2 (e.g., as compared to the difference between output signal levels L1 and L2 in FIG. 9A). FIG. 9C illustrates an example in which antenna 102 has a low impedance such that antenna 102 is mismatched to 5 Ohms. In FIG. 9C, this mismatching is indicated by the relatively large difference between output signal levels L1 and L2 (e.g., as compared to the difference between output signal levels L1 and L2 in FIG. 9A).

As indicated above, FIGS. 9A-9C are provided as examples. Other examples may differ from what is described with regard to FIGS. 9A-9C.

FIG. 10 is a flowchart of an example process 1000 associated with safety compliant receive antenna monitoring. As shown in FIG. 10, process 1000 may include causing, in an antenna monitoring phase, an impedance matching between a test signal generator and at least one component of a receive chain to depend on an impedance of a receive antenna, wherein the antenna monitoring phase is associated with determining an impedance mismatching of the receive antenna (block 1010). For example, a switchable impedance matching circuit (e.g., switchable impedance matching circuit 109) may cause, in an antenna monitoring phase, an impedance matching between a test signal generator (e.g., test signal generator 106) and at least one component of a receive chain (e.g., of device 100) to depend on an impedance of a receive antenna (e.g., antenna 102), as described above. In some implementations, the antenna monitoring phase is associated with determining an impedance mismatching of the receive antenna.

As further shown in FIG. 10, process 1000 may include monitoring the impedance mismatching of the receive antenna in the antenna monitoring phase (block 1020). For example, a control circuit (e.g., included in or communicatively coupled to IF component 114) may monitor the impedance mismatching of the receive antenna in the antenna monitoring phase, as described above.

Process 1000 may include additional implementations, such as any single implementation or any combination of implementations described below and/or in connection with one or more other processes described elsewhere herein.

In some implementations, the determining of the impedance mismatching of the receive antenna is associated with at least one of verifying a connection between the receive antenna and an integrated circuit, detecting a ball break or a partial ball break associated with a connection of the receive antenna, detecting a parasitic connection associated with the receive antenna, or determining a quality of impedance matching of the receive antenna.

In some implementations, the switchable impedance matching circuit is a first switchable impedance matching circuit, and process 1000 may further include causing, by a second switchable impedance matching circuit (e.g., switchable impedance matching circuit 108), the impedance matching between the test signal generator and the at least one component of the receive chain to be increased in a receive chain monitoring phase, wherein the receive chain monitoring phase is associated with monitoring the at least one component of the receive chain, and wherein the impedance matching in the receive chain monitoring phase enables one or more measurements based on a test signal generated by the test signal generator, and causing, by the second switchable impedance matching circuit, a partial impedance mismatching between the test signal generator and the at least one component of the receive chain in a verification phase, where the verification phase may be associated with verifying a return of the first switchable impedance matching circuit and the second switchable impedance matching circuit to impedance matchings caused in an operational phase, and verifying, by the control circuit, operation of the return of the first switchable impedance matching circuit and the second switchable impedance matching circuit in the verification phase.

In some implementations, the second switchable impedance matching circuit does not cause the impedance matching between the test signal generator and the at least one component of the receive chain to be increased in an antenna monitoring phase.

In some implementations, the first switchable impedance matching circuit does not cause the impedance matching between the test signal generator and the at least one component of the receive chain to depend on the impedance of the receive antenna in the receive chain monitoring phase.

In some implementations, the second switchable impedance matching circuit is to cause the impedance matching between the test signal generator and the at least one component of the receive chain to be increased in a confirmation phase, and the first switchable impedance matching circuit is to cause the impedance matching between the test signal generator and the at least one component of the receive chain to depend on the impedance of the receive antenna in the confirmation phase, wherein the confirmation phase is associated with verifying operation of the second switchable impedance matching circuit.

Although FIG. 10 shows example blocks of process 1000, in some implementations, process 1000 may include additional blocks, fewer blocks, different blocks, or differently arranged blocks than those depicted in FIG. 10. Additionally, or alternatively, two or more of the blocks of process 1000 may be performed in parallel.

Figure 11:
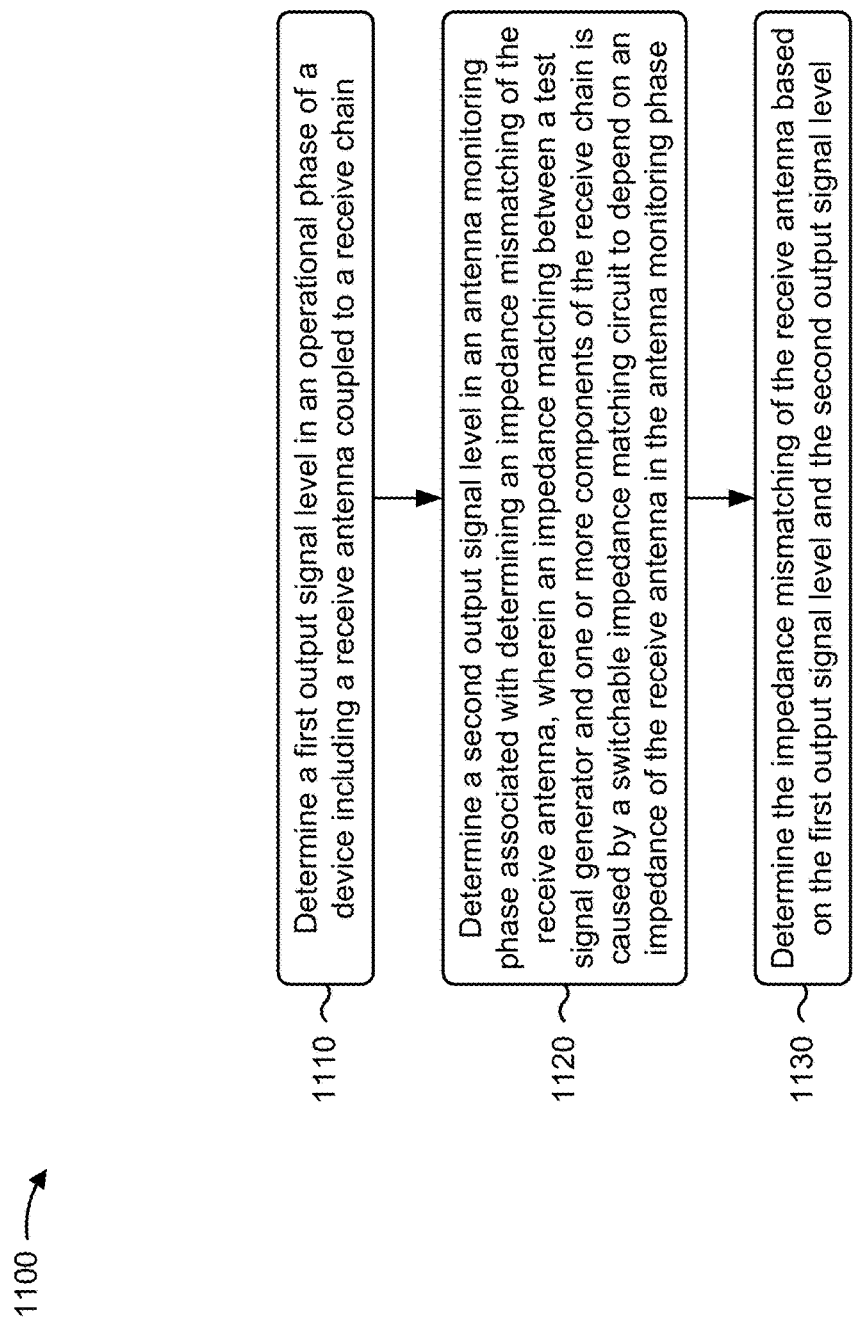

FIG. 11 is a flowchart of an example process 1100 associated with safety compliant receive antenna monitoring.

As shown in FIG. 11, process 1100 may include determining a first output signal level in an operational phase of a device including a receive antenna coupled to a receive chain (block 1110). For example, a control circuit (e.g., included in or communicatively coupled to IF component 114) may determine a first output signal level in an operational phase of a device (e.g., device 100 including a receive antenna (e.g., antenna 102) coupled to a receive chain, as described above.

As further shown in FIG. 11, process 1100 may include determining a second output signal level in an antenna monitoring phase associated with determining an impedance mismatching of the receive antenna, wherein an impedance matching between a test signal generator and one or more components of the receive chain is caused by a switchable impedance matching circuit to depend on an impedance of the receive antenna in the antenna monitoring phase (block 1120). For example, the control circuit may determine a second output signal level in an antenna monitoring phase associated with determining an impedance mismatching of the receive antenna, as described above. In some implementations, an impedance matching between a test signal generator and one or more components of the receive chain is caused by a switchable impedance matching circuit to depend on an impedance of the receive antenna in the antenna monitoring phase.

As further shown in FIG. 11, process 1100 may include determining the impedance mismatching of the receive antenna based on the first output signal level and the second output signal level (block 1130). For example, the control circuit may determine the impedance mismatching of the receive antenna based on the first output signal level and the second output signal level, as described above.

Process 1100 may include additional implementations, such as any single implementation or any combination of implementations described below and/or in connection with one or more other processes described elsewhere herein.

In some implementations, the determining of the impedance mismatching of the receive antenna includes determining whether a difference between the first output signal level and the second output signal level is outside of an impedance matching range, and determining whether the receive antenna is mismatched based on whether the difference is outside of the impedance matching range.

In some implementations, the determining of the impedance mismatching of the receive antenna is associated with verifying a connection between the receive antenna and an integrated circuit.

In some implementations, the determining of the impedance mismatching of the receive antenna is associated with at least one of detecting a ball break or a partial ball break associated with a connection of the receive antenna, detecting a parasitic connection associated with the receive antenna, or determining a quality of impedance matching of the receive antenna.

Although FIG. 11 shows example blocks of process 1100, in some implementations, process 1100 may include additional blocks, fewer blocks, different blocks, or differently arranged blocks than those depicted in FIG. 11. Additionally, or alternatively, two or more of the blocks of process 1100 may be performed in parallel.

The foregoing disclosure provides illustration and description, but is not intended to be exhaustive or to limit the implementations to the precise forms disclosed. Modifications and variations may be made in light of the above disclosure or may be acquired from practice of the implementations.

As used herein, the term "component" is intended to be broadly construed as hardware, firmware, and/or a combination of hardware and software.

As used herein, satisfying a threshold may, depending on the context, refer to a value being greater than the threshold, more than the threshold, higher than the threshold, greater than or equal to the threshold, less than the threshold, fewer than the threshold, lower than the threshold, less than or equal to the threshold, equal to the threshold, or the like.

It will be apparent that systems and/or methods described herein may be implemented in different forms of hardware, firmware, or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be designed to implement the systems and/or methods based on the description herein.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A device, comprising:
   a receive antenna input to couple a receive chain of the device to a receive antenna;
   a test signal generator;
   a switchable impedance matching circuit coupled to the test signal generator and to the receive chain to:
      cause an impedance matching between the test signal generator and at least one component of the receive chain to depend on an impedance of the receive antenna in an antenna monitoring phase,
         wherein the antenna monitoring phase is associated with determining an impedance mismatching of the receive antenna; and
   a control circuit to determine the impedance mismatching of the receive antenna in the antenna monitoring phase.

2. The device of claim 1, wherein the determining of the impedance mismatching of the receive antenna is associated with verifying a connection between the receive antenna and an integrated circuit.

3. The device of claim 1, wherein the determining of the impedance mismatching of the receive antenna is associated with at least one of:
   detecting a ball break or a partial ball break associated with a connection of the receive antenna,
   detecting a parasitic connection associated with the receive antenna, or
   determining a quality of impedance matching of the receive antenna.

4. The device of claim 1, wherein the impedance mismatching of the receive antenna is determined at a component of the receive chain that is downstream from a component of the receive chain at which a test signal generated by the test signal generator is injected into the receive chain.

5. The device of claim 1, wherein the switchable impedance matching circuit is a first switchable impedance matching circuit, and the device further comprises:

a second switchable impedance matching circuit coupled to the test signal generator and to the receive chain to:
cause the impedance matching between the test signal generator and the at least one component of the receive chain to be increased in a receive chain monitoring phase,
wherein the receive chain monitoring phase is associated with monitoring the at least one component of the receive chain of the device, and
wherein the impedance matching in the receive chain monitoring phase enables one or more measurements based on a test signal generated by the test signal generator; and
cause a partial impedance mismatching between the test signal generator and the at least one component of the receive chain in a verification phase,
wherein the verification phase is associated with verifying a return of the first switchable impedance matching circuit and the second switchable impedance matching circuit to impedance matchings caused in an operational phase; and
the control circuit to verify operation of the return of the first switchable impedance matching circuit and the second switchable impedance matching circuit in the verification phase.

6. The device of claim 5, wherein the second switchable impedance matching circuit does not cause the impedance matching between the test signal generator and the at least one component of the receive chain to be increased in the antenna monitoring phase.

7. The device of claim 5, wherein the first switchable impedance matching circuit does not cause the impedance matching between the test signal generator and the at least one component of the receive chain to depend on the impedance of the receive antenna in the receive chain monitoring phase.

8. The device of claim 5, wherein the second switchable impedance matching circuit is to cause the impedance matching between the test signal generator and the at least one component of the receive chain to be increased in a confirmation phase, and the first switchable impedance matching circuit is to cause the impedance matching between the test signal generator and the at least one component of the receive chain to depend on the impedance of the receive antenna in the confirmation phase.

9. The device of claim 8, wherein the confirmation phase is associated with verifying operation of the second switchable impedance matching circuit.

10. The device of claim 1, wherein the device forms at least a part of a radar monolithic microwave integrated circuit.

11. A method, comprising:
causing, by a switchable impedance matching circuit and in an antenna monitoring phase, an impedance matching between a test signal generator and at least one component of a receive chain to depend on an impedance of a receive antenna,
wherein the antenna monitoring phase is associated with determining an impedance mismatching of the receive antenna; and
monitoring, by a control circuit, the impedance mismatching of the receive antenna in the antenna monitoring phase.

12. The method of claim 11, wherein the determining of the impedance mismatching of the receive antenna is associated with at least one of:

verifying a connection between the receive antenna and an integrated circuit,
detecting a ball break or a partial ball break associated with a connection of the receive antenna,
detecting a parasitic connection associated with the receive antenna, or
determining a quality of impedance matching of the receive antenna.

13. The method of claim 11, wherein the switchable impedance matching circuit is a first switchable impedance matching circuit, and the method further comprises:
causing, by a second switchable impedance matching circuit, the impedance matching between the test signal generator and the at least one component of the receive chain to be increased in a receive chain monitoring phase,
wherein the receive chain monitoring phase is associated with monitoring the at least one component of the receive chain, and
wherein the impedance matching in the receive chain monitoring phase enables one or more measurements based on a test signal generated by the test signal generator;
causing, by the second switchable impedance matching circuit, a partial impedance mismatching between the test signal generator and the at least one component of the receive chain in a verification phase,
wherein the verification phase is associated with verifying a return of the first switchable impedance matching circuit and the second switchable impedance matching circuit to impedance matchings caused in an operational phase; and
verifying, by the control circuit, operation of the return of the first switchable impedance matching circuit and the second switchable impedance matching circuit in the verification phase.

14. The method of claim 13, wherein the second switchable impedance matching circuit does not cause the impedance matching between the test signal generator and the at least one component of the receive chain to be increased in an antenna monitoring phase.

15. The method of claim 13, wherein the first switchable impedance matching circuit does not cause the impedance matching between the test signal generator and the at least one component of the receive chain to depend on the impedance of the receive antenna in the receive chain monitoring phase.

16. The method of claim 13, wherein the second switchable impedance matching circuit is to cause the impedance matching between the test signal generator and the at least one component of the receive chain to be increased in a confirmation phase, and the first switchable impedance matching circuit is to cause the impedance matching between the test signal generator and the at least one component of the receive chain to depend on the impedance of the receive antenna in the confirmation phase,
wherein the confirmation phase is associated with verifying operation of the second switchable impedance matching circuit.

17. A system, comprising:
a switchable impedance matching circuit to:
cause, in an antenna monitoring phase, an impedance matching between a test signal generator and at least one component of a receive chain to depend on an impedance of a receive antenna, wherein the antenna monitoring phase is associated with determining an impedance mismatching of the receive antenna; and a control circuit to determine the impedance mismatching of the receive antenna in the antenna monitoring phase.

18. The system of claim 17, wherein the determining of the impedance mismatching of the receive antenna is associated with at least one of:

verifying a connection between the receive antenna and an integrated circuit, detecting a ball break or a partial ball break associated with a connection of the receive antenna, detecting a parasitic connection associated with the receive antenna, or determining a quality of impedance matching of the receive antenna.

19. The system of claim 17, wherein the impedance mismatching of the receive antenna is determined at a component of the receive chain that is downstream from a component of the receive chain at which a test signal generated by the test signal generator is injected into the receive chain.

20. The system of claim 17, wherein the system forms at least a part of a radar monolithic microwave integrated circuit.

\* \* \* \* \*